(12) United States Patent
Srinivasa

(10) Patent No.: US 11,854,253 B2
(45) Date of Patent: Dec. 26, 2023

(54) APPARATUS, METHOD, AND COMPUTER-READABLE MEDIUM FOR ROBUST RESPONSE TO ADVERSARIAL PERTURBATIONS USING HYPERDIMENSIONAL VECTORS

(71) Applicant: Intel Corporation, Santa Clara, CA (US)

(72) Inventor: Narayan Srinivasa, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 157 days.

(21) Appl. No.: 17/359,520

(22) Filed: Jun. 26, 2021

(65) Prior Publication Data

US 2021/0327376 A1    Oct. 21, 2021

(51) Int. Cl.
  *G06V 20/00*    (2022.01)
  *G09G 3/36*    (2006.01)
  *G09G 3/20*    (2006.01)
  *G06N 3/08*    (2023.01)
  *G06F 30/34*    (2020.01)
  *G06F 18/214*    (2023.01)
  (Continued)

(52) U.S. Cl.
  CPC ............ *G06V 20/00* (2022.01); *G06F 18/214* (2023.01); *G06F 30/34* (2020.01); *G06N 3/08* (2013.01); *G06V 10/454* (2022.01); *G06V 10/764* (2022.01); *G06V 10/774* (2022.01); *G09G 3/2003* (2013.01); *G09G 3/3607* (2013.01)

(58) Field of Classification Search
  CPC .... G06V 20/00; G06V 10/454; G06V 10/764; G06V 10/774; G06F 18/214; G06F 30/34; G06N 3/08; G06N 3/045; G09G 3/2003; G09G 3/3607; G06T 1/20
  See application file for complete search history.

(56) References Cited

U.S. PATENT DOCUMENTS 11,610,115 B2 *  3/2023  Kar .................. G06T 11/00
11,631,193 B1 *  4/2023  Akbas ............... G06V 10/82
                                                         382/103

(Continued)

OTHER PUBLICATIONS

Szegedy et al., "Intriguing properties of neural networks," In Proc. ICLR Feb. 19, 2014, 10 pages.

(Continued)

*Primary Examiner* — Grant Sitta
(74) *Attorney, Agent, or Firm* — HANLEY, FLIGHT & ZIMMERMAN, LLC

(57) ABSTRACT

Apparatuses, methods, and articles of manufacture are disclosed. An example apparatus includes processor circuitry to assign a location value hyperdimensional vector (HDV) to a location in an image of a first patch of one or more pixels, assign at least a first channel HDV to the first patch, determine at least one pixel intensity value HDV for each of the one or more pixels in the first patch, bind together each of the pixel intensity value HDVs into at least one patch intensity value HDV, bind together the at least first channel HDV and the at least one patch intensity value HDV to produce a patch consensus intensity HDV, and generate a first hyperdimensional representation patch value HDV of the first patch by binding together at least a combination of the patch consensus intensity HDV and the location value HDV.

25 Claims, 18 Drawing Sheets

(51) Int. Cl.
   G06V 10/764    (2022.01)
   G06V 10/774    (2022.01)
   G06V 10/44     (2022.01)

(56) References Cited

U.S. PATENT DOCUMENTS

| | | | | |
|---|---|---|---|---|
| 11,669,724 | B2* | 6/2023 | Sallee | G06N 3/08 |
| | | | | 706/25 |
| 11,686,848 | B2* | 6/2023 | Tu | G06F 18/217 |
| | | | | 702/152 |
| 2019/0370598 | A1* | 12/2019 | Martin | G06V 10/768 |
| 2021/0004648 | A1* | 1/2021 | Ghosh | G06F 18/2148 |
| 2021/0064938 | A1* | 3/2021 | Ahuja | G06V 10/764 |
| 2021/0117791 | A1* | 4/2021 | Song | G06N 3/04 |
| 2021/0326756 | A1* | 10/2021 | Khaleghi | G06F 18/211 |
| 2022/0108135 | A1* | 4/2022 | Brady | G06F 18/213 |
| 2022/0130019 | A1* | 4/2022 | Jeong | G06N 3/04 |
| 2022/0147758 | A1* | 5/2022 | Hiromoto | G06N 3/08 |
| 2022/0277194 | A1* | 9/2022 | Hiromoto | G06N 3/08 |

OTHER PUBLICATIONS

Athalye et al., "Synthesizing Robust Adversarial Examples," In Proc. of the 35th International Conference on Machine Learning, 284-293 (2018), 10 pages.
Karmon et al., "Localized and Visible Adversarial Noise," In Proc. of the 35th International Conference on Machine earning, 2507-2515 (2018), 9 pages.
Nguyen et al., "Deep Neural Networks are Easily Fooled: High Confidence Predictions for Unrecognizable Images," In Proceedings of the IEEE Conference on Computer Vision and Pattern Recognition, 427-436 (2015), 10 pages.
Papernot et al., "The Limitations of Deep learning in Adversarial Settings," In IEEE European Symposium on Security and Privacy, 372-387 Nov. 24, 2015, 16 pages.
Biggio et al., "Wild Patterns: Ten Years After the Rise of Adversarial Machine Learning," Pattern Recognition, 84, 317-331 Jul. 19, 2018, 17 pages.
Brendel et al., "Adversarial Vision Challenge," Preprint at https://arxiv.org/abs/1808.01976 Dec. 6, 2018, 10 pages.
Eykholt et al., "Robust Physical-World Attacks on Deep Learning Visual Classification," In Proc. of the IEEE Conference on Computer Vision and Pattern Recognition, 1625-1634 Apr. 10, 2018, 11 pages.
Madry et al., "Towards Deep Learning Models Resistant to Adversarial Attacks," Sep. 4, 2019, 28 pages.
Rusak et al., "Increasing the Robustness of DNNs Against Image Corruptions by Playing the Game of Noise," Jan. 2020, 8 pages. (Abstract only).
Xie et al., "Mitigating Adversarial Effects Through Randomization". Published as a conference paper at ICLR Feb. 28, 2018, 16 pages.
Dhillon et al., "Stochastic Activation Pruning for Robust Adversarial Defense," Published as a conference paper at ICLR, Mar. 5, 2018, 13 pages.
Liu et al., "Towards Robust Neural Networks via Random Self-ensemble," Dec. 2017, 17pages.
He et al., "Parametric Noise Injection: Trainable Randomness to Improve Deep Neural Network Robustness against Adversarial Attack," Nov. 2018, 10 pages.
Shridhar et al., "ProbAct: A Probabilistic Activation Function for Deep Neural Networks," Jun. 16, 2020, 14 pages.
Shafahi et al., "Adversarial training for free!" Advances in Neural Information Processing Systems 32. Ed. by H Wallach et al. Curran Associates, Inc., Nov. 20, 2019, pp. 3358-3369, 12 pages.
Wong et al., "Fast is better than free: Revisiting adversarial training," Jan. 12, 2020, 17 pages.
Tsipras et al., "Robustness May Be at Odds with Accuracy," Sep. 9, 2019, 24 pages.
Sharma et al., "Attacking the Madry Defense Model with L1-based Adversarial Examples," Jul. 27, 2018, 9 pages.
Schott et al., "Towards the First Adversarially Robust Neural Network Model on MNIST," Sep. 20, 2018, 16 pages.
Athalye et al., "Obfuscated Gradients Give a False Sense of Security: Circumventing Defenses to Adversarial Examples," Jul. 31, 2018, 12 pages.
Pentti Kanerva, "Hyperdimensional Computing: an Introduction to Computing in Distributed Representation with High-Dimensional Random Vectors," Cognit. Comput. 1, 139-159, Jan. 28, 2009, 21 pages.
Song et al., "PixelDefend: Leveraging Generative Models to Understand and Defend Against Adversarial Examples," May 21, 2018, 20 pages.
Goodfellow et al., "Explaining and Harnessing Adversarial Examples," Mar. 20, 2015, 11 pages.
Kurakin et al., "Adversarial Machine Learning at Scale," Feb. 11, 2017, 17 pages.
Moosavi-Dezfooli et al., "DeepFool: a Simple and Accurate Method to Fool Deep Neural Networks," In Proceedings of the IEEE Conference on Computer Vision and Pattern Recognition, pp. 2574-2582, 2016, 9 pages.
Carlini et al., "Towards Evaluating the Robustness of Neural Networks," In Security and Privacy (SP), IEEE Symposium on, pp. 39-57. IEEE, Mar. 22, 2017, 19 pages.
Rahimi et al., "Hyperdimensional Computing for Noninvasive Brain-Computer Interfaces: Blind and One-Shot Classification of EEG error-related potentials," in Proc. 10th EAI Int. Conf. Bioinspired Information and Communications Technologies, 2017. 8 pages.
Mitrokhin et al., "Learning Sensorimotor Control with Neuromorphic Sensors: Toward Hyperdimensional Active Perception," Science Robotics, May 15, 2019, 26 pages.
Mitrokhin et al., "Symbolic Representation and Learning with Hyperdimensional Computing," Front. Robot. AI, Jun. 9, 2020, https://doi.org/10.3389/frobt.2020.00063. 16 pages.
Krizhevsky et al., "ImageNet Classification with Deep Convolutional Neural Networks," NIPS 2012, 9 pages.

* cited by examiner

APPARATUS, METHOD, AND COMPUTER-READABLE MEDIUM FOR ROBUST RESPONSE TO ADVERSARIAL PERTURBATIONS USING HYPERDIMENSIONAL VECTORS

FIELD OF THE INVENTION

The invention relates to artificial neural networks. More specifically, the invention relates to adversarial perturbations introduced to training and classification performed by artificial neural networks.

BACKGROUND

Artificial neural networks, such as convolutional neural networks (CNNs), are utilized for many tasks. Among those tasks are learning to accurately make predictions. For example, a CNN can receive a large amount of image data and learn, through machine learning (ML) to classify content in images based on how close the content resembles a true/original image of a given object.

BRIEF DESCRIPTION OF THE DRAWINGS

The figures are not to scale. Instead, the thickness of the layers or regions may be enlarged in the drawings. In general, the same reference numbers will be used throughout the drawing(s) and accompanying written description to refer to the same or like parts.

Figure 1:
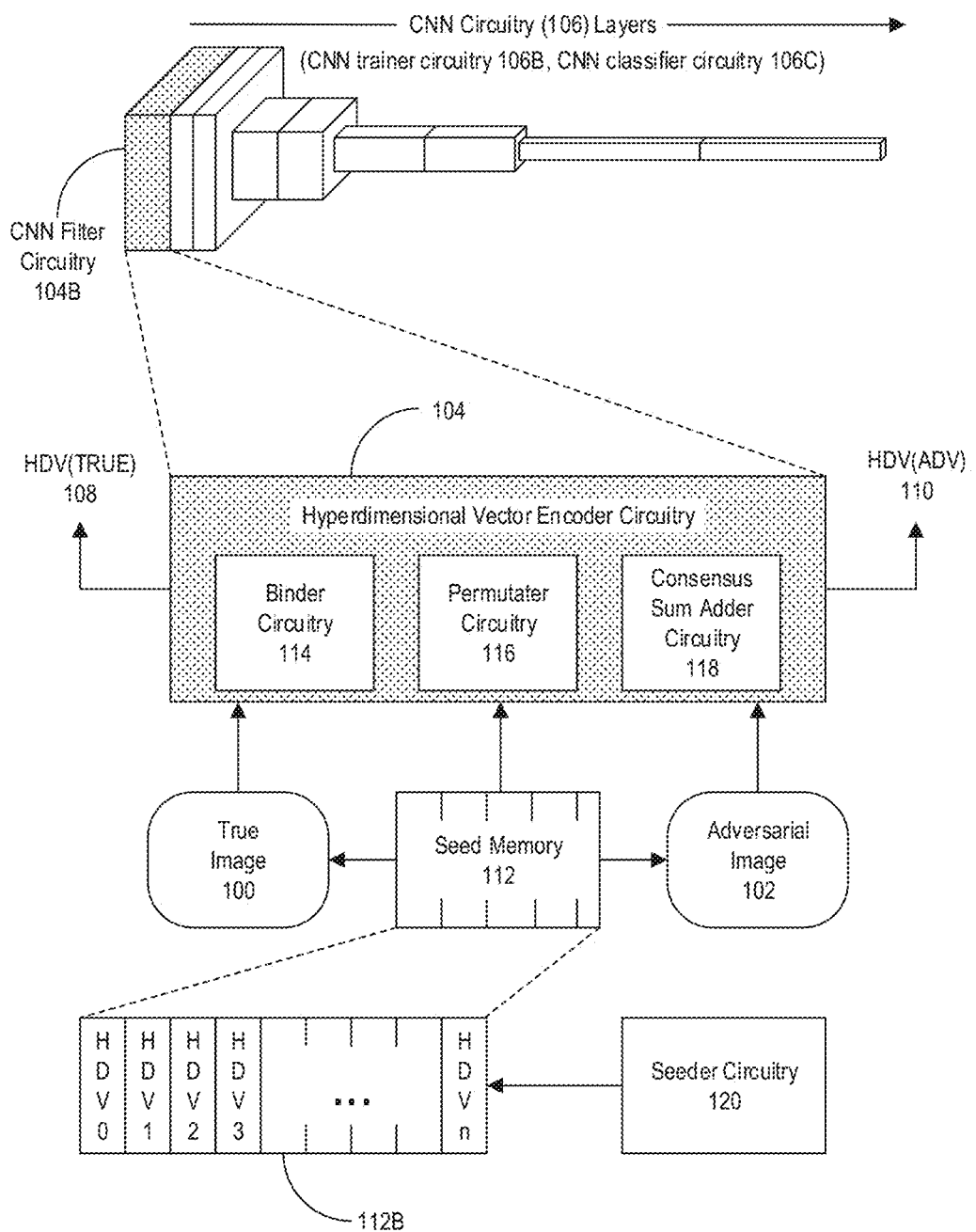
FIG. 1 is a schematic illustration of an example system architecture that utilizes hyperdimensional vectors (HDVs) to respond to adversarial perturbations.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events. As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

DETAILED DESCRIPTION

Artificial neural networks, such as convolutional neural networks (CNNs), are utilized for many tasks. Among those tasks is learning to accurately make predictions. For example, a CNN can receive a large amount of image data and learn, through machine learning (ML), to classify content in images based on how close the content resembles a true/original image of a given object.

The task of image classification comes with its own set of hazards. Adversarial perturbations in images (e.g., deviations of data added to images) have a tendency to make CNNs fail to accurately predict the category of the object in an image. These perturbations can sometimes be so small that they are imperceptible to a person looking at the image. But to a CNN that is processing the image for classification, sometimes even a very small perturbation (e.g., a small set of pixels in an image compared to the entire set of pixels in the image) can cause a CNN to misclassify the image (e.g., the classification of one or more objects in the image).

Permutation and binding operations have been used to compare images. But comparing an image with an adversarial perturbation to an original image in one pass using a combination of permutation and binding operators does not work well for image classification problems, especially when the image is dense. The combination of permutation and binding makes the resulting hyperdimensional vector (HDV) unique and very dissimilar to any other image including an adversarial version of itself. Thus, the resulting HD vectors are sensitive to mismatches in even a single pixel which is highly likely in adversarial perturbations.

FIG. 1 is a schematic illustration of an example system architecture that utilizes HDVs to respond robustly to adversarial perturbations. In some examples, the HDVs are binary vectors of 10,000 dimensions, represented by 10,000-bit values. For a 10,000-bit value, the number of unique vectors is $2^{10,000}$, which forms a 10,000-dimension hypercube. In other examples, the binary vectors can be represented by a smaller or larger number of bits. Arbitrary binary vectors within this example hypercube represent values across the complete space. For a set of vectors with 10,000-bit values, the average Hamming distance between HDVs is 5,000 bits by a binomial distribution, with a standard deviation of 50 bits. Straying from an average distance between any two random vectors is unusual and, therefore, HDVs are quite tolerant/robust to noise in measurements. Although examples using image data are described herein, this same process can be utilized with audio data or other types of sensory data as well.

In some examples, an image (true 100 or adversarial 102) is first passed through a HDV encoder circuitry 104. In some examples, the HDV encoder 104 circuitry is central processing unit (CPU) circuitry executing instructions to perform the encoder tasks. In some examples, the HDV encoder 104 circuitry is graphics processing unit (GPU) circuitry executing instructions to perform the encoder tasks. In some examples, the HDV encoder circuitry 104 is field programmable gate array (FPGA) circuitry executing instructions to perform the encoder tasks. In some examples, one or more other types of processors or controllers may include circuitry that executes instructions to perform the encoder tasks. In some examples, circuitry in multiple processors may execute instructions to perform the encoder tasks. In some embodiments, the encoder logic resides as software or firmware instructions in a memory/storage that is loaded into one or more of the processors that have been described above. In some examples, the encoder logic is custom hardware circuitry designed to perform one or more of the encoder tasks. In some examples, the encoder logic is implemented in a combination of software instructions and hardware circuitry.

In the illustrated example, the HDV encoder 104 circuitry encodes the image through a series of operations into a HDV. The example HDV sent as input into a convolutional neural network (CNN) 106. In some examples, the CNN 106 is circuitry that is instantiated in processor circuitry. The illustrated example CNN circuitry 106 has multiple layers. In some examples, CNN filter circuitry 104B, CNN trainer circuitry 106B, and CNN classifier circuitry 106C are all a part of the broader scope of CNN circuitry 106. For clarity, as used herein in some descriptions the encoder circuitry 104 and the seeder circuitry 120 are used to describe the apparatus of FIG. 1 and in other descriptions the CNN circuitry 106 (including CNN filter circuitry 104B, CNN trainer circuitry 106B, and CNN classifier circuitry 106C) are used to describe the apparatus in FIG. 1. In many examples, these descriptive components listed immediately above are the same circuitry shown at different levels of the apparatus. For example, a true image 100 being received by encoder circuitry 104 is the same as a true image 100 being received by CNN filter circuitry 104B (since 104B is just a different format of showing 104, specifically as a filter for data being fed into the overall structure of CNN 106).

The example HDV is either the HDV(TRUE) 108 for a HDV encoded from the true image or the HDV(ADV) 110 for a HDV encoded from an adversarial image. The example HDV (108 or 110) builds a CNN-based classifier to allow the CNN 106 first train and then infer classifications of each image passed through the encoder 104. In some examples, the encoder circuitry 104 is a preprocessor that filters data entering the remaining layers of the CNN circuitry 106.

In the illustrated example, a seed memory 112 (i.e., shown in more detail in the 112B pop out) stores HDVs (e.g., HDV 0 to HDV n). The example encoder 104 uses the stored HDVs for several purposes. In some examples, the seed memory 112 includes information in HDVs for a minimum pixel intensity level, three-color channels, permutation operators for row and column pixel locations in an image, and the locations of each of a set of portions of an image (herein referred to as "patches").

In some examples, encoding an image using HDVs includes determining values of the pixel intensities for each of the pixels in an image as well as the locations of each pixel in the image. In some examples, a pixel intensity refers to either a grayscale value of a pixel or a set of three color values of the pixel. If the example image is grayscale, each pixel would include an intensity of how light or dark it is on a scale of white to black (with many levels of gray between the endpoints).

In the more common example of a color image, there is a red channel value, a green channel value, and a blue channel value. These values, when combined, refer to the pixel intensity value of a pixel in a color image. The number of bits representing each of the three color channels represents the depth of the color of the pixel (or in the case of grayscale, the depth of the grayscale). For example, if each of the red, blue, and green channels have 8 bits representing the range of colors for each of the three channels, the pixel is said to have an 8-bit color depth. In other examples, color depth per pixel can be 16-bit, 32-bit, and so on (the same depth applies to a grayscale image, only with a single channel being used to represent the depth).

In some examples, for a 2D image of a certain size (e.g., an X,Y image size with X*Y total pixels), the location of any given pixel is represented by an X value and a Y value in the image. In some examples, three types of operations are performed using the pixel intensity information and the pixel location information to encode image information into HDVs. The operation types are: a binding operation, a consensus sum operation, and a permutation operation.

In the illustrated example of FIG. 1, the binding operation is performed by binder logic (binder circuitry 114) in the HDV encoder 104. Since the example binder circuitry 114 is in the HDV encoder 104, as discussed above regarding the HDV encoder 104, an instantiation of the example binder circuitry 114 may be present in custom hardware circuitry, as stored instructions that are then executed by one or more types of hardware circuitry, or in any combination of software, firmware, and/or hardware.

The binding operation can also be referred to herein as multiplication. In some examples, binding is performed with an XOR (exclusive OR) operation on binary HDVs. An XOR operation is an involution when one operand is fixed, associative, and commutative. The term "operand" as used herein refers to a vector (or a portion of a vector) in a vector operation, such as the binding operation. When two HDVs, A and B, are bound together into a third HDV, C, with the binder circuitry 114, then A can be recovered by unbinding B from C and/or B can be recovered by unbinding A from C. The unbinding is performed also with an XOR operation on binary HDVs. In some examples, when two HDVs, A and B, are bound to a third HDV, C, the Hamming distance between A and B remains unchanged.

In the illustrated example, the permutation operation is performed by permuter logic (permuter circuitry 116) in the HDV encoder 104. Since the example permuter circuitry 116 is in the HDV encoder 104, as discussed above regarding the HDV encoder 104, an instantiation of the example permuter circuitry 116 may be present in custom hardware circuitry, as stored instructions that are then executed by one or more types of hardware circuitry, or in any combination of software, firmware, and/or hardware.

In some examples, the permuter circuitry 116 permutes components within HDVs into a new order by computing the product Px. If the permutation is randomly generated for a long binary vector of N bits, then the permuted vector is likely to have a Hamming distance of N/2 (or close to N/2) based on a random generation of bits each having a 50% chance of staying the same vs. flipping at each bit position in the long binary vector. In some examples, P can be represented as a permutation of index locations 1 to N, where N is the number of bits in the long binary vector (e.g., N=10,000 in the described examples above). Therefore, in some examples, the product Px simply swaps components within vector x to the order in the P permutation. The term "component" used herein refers to a bit in a vector (e.g., if a component is swapped in a vector, the bit the component is referring to is swapped). In some examples, permutation preserves similarity and can be used to encode order information in sequences of location operations.

In the illustrated example, the consensus sum operation is performed by consensus sum adder logic (consensus sum adder circuitry 118) in the HDV encoder 104. Since the example consensus sum adder circuitry 118 is in the HDV encoder 104, as discussed above regarding the HDV encoder 104, an instantiation of the example consensus sum adder circuitry 118 may be present in custom hardware circuitry, as stored instructions that are then executed by one or more types of hardware circuitry, or in any combination of software, firmware, and/or hardware.

The consensus sum operation can also be referred to herein as bundling. In some examples, the consensus sum operation uses an addition operator to generate a sum that counts the 1s and 0s in each bit in a set of HDVs. In some examples, the resulting HDV generated from the consensus sum operation is a vector where each bit represents the more common value at that bit for each of the HDVs in the set of HDVs on which the consensus sum operation was performed. For example, a consensus sum operation is performed on a set of five HDVs (HDV1, HDV2, HDV3, HDV4, and HDV5). The value of the first bit in each of the five HDVs are the following:

HDV1(bit loc 0)=1
HDV2(bit loc 0)=1
HDV3(bit loc 0)=0
HDV4(bit loc 0)=1
HDV5(bit loc 0)=0

A value of "1" is present at bit location 0 in three of the five HDVs and a value of "0" is present at bit location 0 in two of the five HDVs. Therefore, in some examples, the resulting HDV that is generated from the consensus sum operation of HDVs 1-5 will have a "1" in its bit location 0 because there were more "1" values than "0" values at the set of bit location 0 in the five HDVs.

In some examples, this process is repeated across each of the bit locations. In the case of a tie at a given bit location with an even number of HDVs, the resulting HDV may have a randomly chosen "0" or "1" at that bit location. A consensus sum generated with fewer operand HDVs will result in a HDV that is like (similar to) it's operand HDVs, but similarity to operands decreases as more operand HDVs are used.

In some examples, an image is segmented into a number of patches, each patch being a subset of the pixels of the image (e.g., an 8×8 grid of segmented patches of an image would generate 64 image patches). The example patches are operated on separately by the encoder circuitry 104. Then a consensus sum is used to bundle all 64 example image patches together into a single resulting HDV to be sent to the CNN 106. Segmenting the image into a set of patches to be operated on separately and then bundled back together prior to sending the resulting HDV to the CNN is referred to herein as a multiset or a "bag of words" technique.

In some examples, preserving the significance of the intensity and the location of pixels in an image assists in the encoding of images using HDVs. For example, an 8-bit grayscale image has 256 unique values that are possible for each pixel across the space of intensities. In some examples, there are more or less unique values than 256 (e.g., for a 16-bit grayscale image, there are 65,536 unique values). In some examples of 8-bit grayscale, each of the 256 unique values are spaced evenly from one another. In some examples, to reconstruct this scale with HDVs, 256 HDVs are designated in the seed memory 112. In the illustrated example, seeder logic (seeder circuitry 120) will assign/designate the 256 HDVs in the seed memory 112.

In the illustrated example, seeding the seed memory 112 is performed by the seeder circuitry 120. In the illustrated example, the seeder circuitry 120 is separate from the encoder circuitry 104. In other examples, the seeder circuitry 120 is a part of the encoder circuitry 104. In some examples, an instantiation of the seeder circuitry 120 may be present in custom hardware circuitry, as stored instructions that are then executed by one or more types of hardware circuitry, or in any combination of software, firmware, and/or hardware.

In some examples, the 256 HDVs are each 10,000 bits in length. In other examples, the 256 HDVs are each less than or greater than 10,000 bits, but each of the HDVs have the same number of bits (herein represented by "D" bits). In some examples, the 256 HDVs are spaced apart by their Hamming values. In some examples, the 256 HDVs are spaced apart such that the nearest neighbors of a particular intensity value are also the closest vectors in the hyperdimensional space (i.e., closest Hamming distance). Likewise, intensity values that are further away from each other have a higher Hamming distance proportionally.

In some examples, the seeder circuitry 120 chooses a random HDV in the seed memory 112 to represent the minimum pixel intensity level. In some examples, the seeder circuitry 120 then moves through an assignment phase in the seed memory 112 by assigning a pixel intensity value HDV to each of the 256 intensity levels, starting with the minimum intensity level and successively moving up the intensity scale.

In some examples, the seeder circuitry 120 designates a next HDV by randomly flipping D/510 of its bits for the next higher intensity level and then continues to repeat the process. More specifically, D/2/(m−1) is the number of bits the example seeder circuitry 120 flips per intensity level, wherein "m" is the number of unique intensity levels. In this example, the resulting number of bits flipped between each intensity level comes from the following numerical equation: 10000/2/(256−1). Again, once an example bit is flipped, it will not be flipped back. Therefore, as the example seeder circuitry 120 works through the assignment/designation phase of the pixel intensity value HDVs in seed memory 112, more bits for each successive intensity level are locked from flipping. As a result of the seeding, the minimum and maximum intensity levels (level 0 and level 255) are D/2 bits apart, which means they are orthogonal to each other in Hamming distance.

In some examples, image data from a true image 100 or an adversarial image 102 is processed by the encoder circuitry 104. In some examples, for each pixel in the image being processed, a pixel intensity value is determined and the pixel intensity value HDV that was and designated (during the seeding process) for the determined intensity level is assigned to the pixel. This assigned pixel intensity value HDV for the given pixel is then used in tandem with other assigned pixel intensity value HDVs as operands for further calculations related to binding, permuting location values, and consensus sum adding, which are described below.

In some examples, the pixel intensity value HDVs for each pixel in a patch of an image (as well as for each pixel in the entire image) are matched to locations to accurately represent the image. For example, for a given image, the image contains a series of rows (R) and columns (C) and a pixel at a given R,C location value has a certain pixel intensity. Thus, in some examples, the pixel intensity value HDVs are permutated to portray positional semantics with a sequence of HDVs.

Take an example 3×3 patch in a grayscale image, the patch is represented by nine pixel intensity value HDVs. The set of permutations performed to place each pixel intensity value HDV in its proper location is shown in Equation 1 below.

Equation 1: An example of permutating a 3×3 grayscale image patch.

$$\left(\left(\begin{array}{c}(X_{11}*CX_{12}*C^2X_{13})*\\R(X_{21}*CX_{22}*C^2X_{23})*\\R^2(X_{31}*CX_{32}*C^2X_{33})\end{array}\right)\right).$$

Assume an initial upper left R,C patch location value is known to locate the first pixel in the patch within the full image. A row permutate operator performed by the example permutater circuitry 116 to get to the next row down is represented by R (to get two rows down the R permutate operator is applied twice, represented by $R^2$). A column permutate operator performed by the example permutater circuitry 116 to get to the next column to the right is represented by C (to get two columns across the C permutate operator is applied twice, represented by $C^2$). Additionally, each pixel intensity value HDV is represented by X followed by the R,C location of the X in the patch (e.g., the upper left pixel intensity value HDV is represented by $X_{11}$ and the lower right pixel intensity value HDV is represented by $X_{33}$). Finally, the "*" represents the bind operator.

In the illustrated example in Equation 1, to permutate the nine pixel intensity value HDVs, first, the top row of three pixel intensity value HDVs is permutated by the example permutater circuitry 116 and then bound together by the example binder circuitry 114. Then the middle row of three pixel intensity value HDVs is permutated by the example permutater circuitry 116 and then bound together by the example binder circuitry 114. And then the bottom row of three pixel intensity value HDVs is permutated by the example permutater circuitry 116 and then bound together by the example binder circuitry 114.

After the pixels in each row are bound together, then the three rows are bound together. Each binding generates a new HDV that incorporates all of the data from the previous bindings. In some examples, the upper left pixel in a given patch does not need a permutation because it is the origin from which the location permutations on all other pixels in the patch are based. In the illustrated example, the result generated from Equation 1 is a patch intensity value HDV. In some examples, the patch intensity value HDV includes the pixel intensity values for each of the nine pixels in the patch and the pixel location values from the location permutations per pixel.

In example Equation 2 below, the set of operators are shown for processing a 3×3 pixel patch with red, green, and blue color channels.

Equation 2:

An example of permutating a 3×3 grayscale image patch.

$$L_p * \left\{ H_R * \begin{pmatrix} (X_{11}^R * CX_{12}^R * C^2 X_{13}^R)* \\ R(X_{21}^R * CX_{22}^R * C^2 X_{23}^R)* \\ R^2(X_{31}^R * CX_{32}^R * C^2 X_{33}^R) \end{pmatrix} + {}_cH_G * \begin{pmatrix} (X_{11}^G * CX_{12}^G * C^2 X_{13}^G)* \\ R(X_{21}^G * CX_{22}^G * C^2 X_{23}^G)* \\ R^2(X_{31}^G * CX_{32}^G * C^2 X_{33}^G) \end{pmatrix} + \right.$$

$$\left. {}_cH_G * \begin{pmatrix} (X_{11}^B * CX_{12}^B * C^2 X_{13}^B)* \\ R(X_{21}^B * CX_{22}^B * C^2 X_{23}^B)* \\ R^2(X_{31}^B * CX_{32}^B * C^2 X_{33}^B) \end{pmatrix} \right\}.$$

The example patch is represented by nine pixel intensity value HDVs for each color channel. The three color channels shown are represented as follows:

The red color channel designated by the pixel intensity value HDVs with $X^R$.

The green color channel designated by the pixel intensity value HDVs with $X^G$.

The blue color channel designated by the pixel intensity value HDVs with $X^B$.

In some examples, the same order of operations for permutating and then binding the pixel intensity value HDVs are performed by the example permutater circuitry 116 and the example binder circuitry 114 as they were in Equation 1, but with Equation 2 the operations are done for each color channel. Thus, three patch intensity value HDVs are generated instead of the one patch intensity value HDV generated above from Equation 1.

In some examples, each of the three patch intensity value HDVs are bound to a respective channel HDV by binder circuitry 114. The channel HDVs are represented in Equation 2 by the H operand and each channel HDV is designated with its respective color (e.g., $H_R$ for the red channel HDV, $H_G$ for the green channel HDV, and $H_B$ for the blue channel HDV). In some examples, the seeder circuitry 120 assigns the three channel HDVs in the seed memory 112 for the red, green, and blue channels.

Thus, in some examples, after the binding per channel HDV to the respective patch intensity value HDV, the $H_R$, $H_G$, and $H_B$ channel HDVs incorporate all of the pixel intensities and pixel locations for the patch. In some examples, the binding of the channel HDVs with the respective patch intensity value HDVs generate/produce HDVs referred to as color channel image patch HDVs.

In some examples, the Equation 2 illustrates that a consensus sum operation is then performed by consensus sum adder circuitry 118 to the three channel HDVs to create a patch consensus HDV.

In some examples, the seeder circuitry 120 assigns a location value HDV in the seed memory 112. the location value HDV is represented in Equation 2 by the L operand. Specifically, the L operand for patch P is designated as $L_P$.

In Equation 2, the patch consensus HDV is then bound to the location value HDV with the example binder circuitry 114 to generate a hyperdimensional representation patch value HDV for the patch. The example hyperdimensional representation patch value HDV is generated from the set of operations outlined above in reference to Equation 2. The example hyperdimensional representation patch value HDV is represented by an $H_P$ operand (where H refers to the intensity and P is the designated location of the patch).

In example Equation 3 below, the set of operators are shown for processing all of the patches that make up an image to produce a hyperdimensional representation whole image value HDV.

Hyperdimensional Representation Whole Image Value $HDV = (H_{P1} + {}_c \ldots + {}_c H_{Pn})$ Equation 3: An example of calculating the consensus sum color image patch.

In the example Equation 3, a set of n patches for an image have each had the operations performed described above in reference to Equation 2. Therefore, in some examples, a set of n $H_P$ values from $H_{P1}$ to $H_{Pn}$ are generated. Then, the example consensus sum adder circuitry 118 performs a consensus sum operation on the set of a set of n $H_P$ values and the generated result is a hyperdimensional representation whole image value HDV (herein referred to as a "final" HDV for an image). In some examples, this final HDV can then be fed to the CNN 106 for training as HDV(TRUE) 108 if the image provided was the original. Otherwise, the final HDV can be fed to the CNN 106 for classification as HDV(ADV) 110.

In some examples, once the CNN 106 has received both the HDV(TRUE) value 108 (and has trained with the HDV(TRUE) value 108) and one or more HDV(ADV) values 110, the CNN 106 can perform one or more comparisons to determine a classification of each HDV(ADV) value 110. In some examples, the encoder circuitry 104 performs a Hamming distance comparison between the HDV(TRUE) value 108 and one or more HDV(ADV) values 110. In some examples, the CNN 106 and/or the encoder circuitry 104 performs one or more other comparisons of the HDV(TRUE) value 108 with one or more HDV(ADV) values 110.

While an example manner of implementing the apparatus that utilizes hyperdimensional vectors (HDVs) to respond robustly to adversarial perturbations is illustrated in FIG. 1, one or more of the elements, processes, and/or devices illustrated in FIG. 1 may be combined, divided, re-arranged, omitted, eliminated, and/or implemented in any other way. Further, the example hyperdimensional vector encoder circuitry 104, the example binder circuitry 114, the example permutater circuitry 116, the example consensus sum adder circuitry 118, the example seeder circuitry 120, and/or, more generally, the example apparatus and system of FIG. 1, may be implemented by hardware, software, firmware, and/or any combination of hardware, software, firmware, and/or firmware. Thus, for example, any of the example hyperdimensional vector encoder circuitry 104, the example binder circuitry 114, the example permutater circuitry 116, the example consensus sum adder circuitry 118, the example seeder circuitry 120, and/or, more generally, the example system of FIG. 1, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC (s)), programmable logic device(s) (PLD(s)), and/or field programmable logic device(s) (FPLD(s)) such as Field Programmable Gate Arrays (FPGAs). When reading any of the apparatus or system claims of this patent to cover a purely software and/or firmware implementation, at least one of the example the example hyperdimensional vector encoder circuitry 104, the example binder circuitry 114, the example permutater circuitry 116, the example consensus sum adder circuitry 118, the example seeder circuitry 120, and/or, more generally, the example apparatus and system of FIG. 1 is/are hereby expressly defined to include a non-transitory computer readable storage device or storage disk such as a memory, a digital versatile disk (DVD), a compact disk (CD), a Blu-ray disk, etc., including the software and/or firmware. Further still, the example apparatus and system of FIG. 1 may include one or more elements, processes, and/or devices in addition to, or instead of, those illustrated in FIG. 1, and/or may include more than one of any or all of the illustrated elements, processes and devices.

Figure 2:
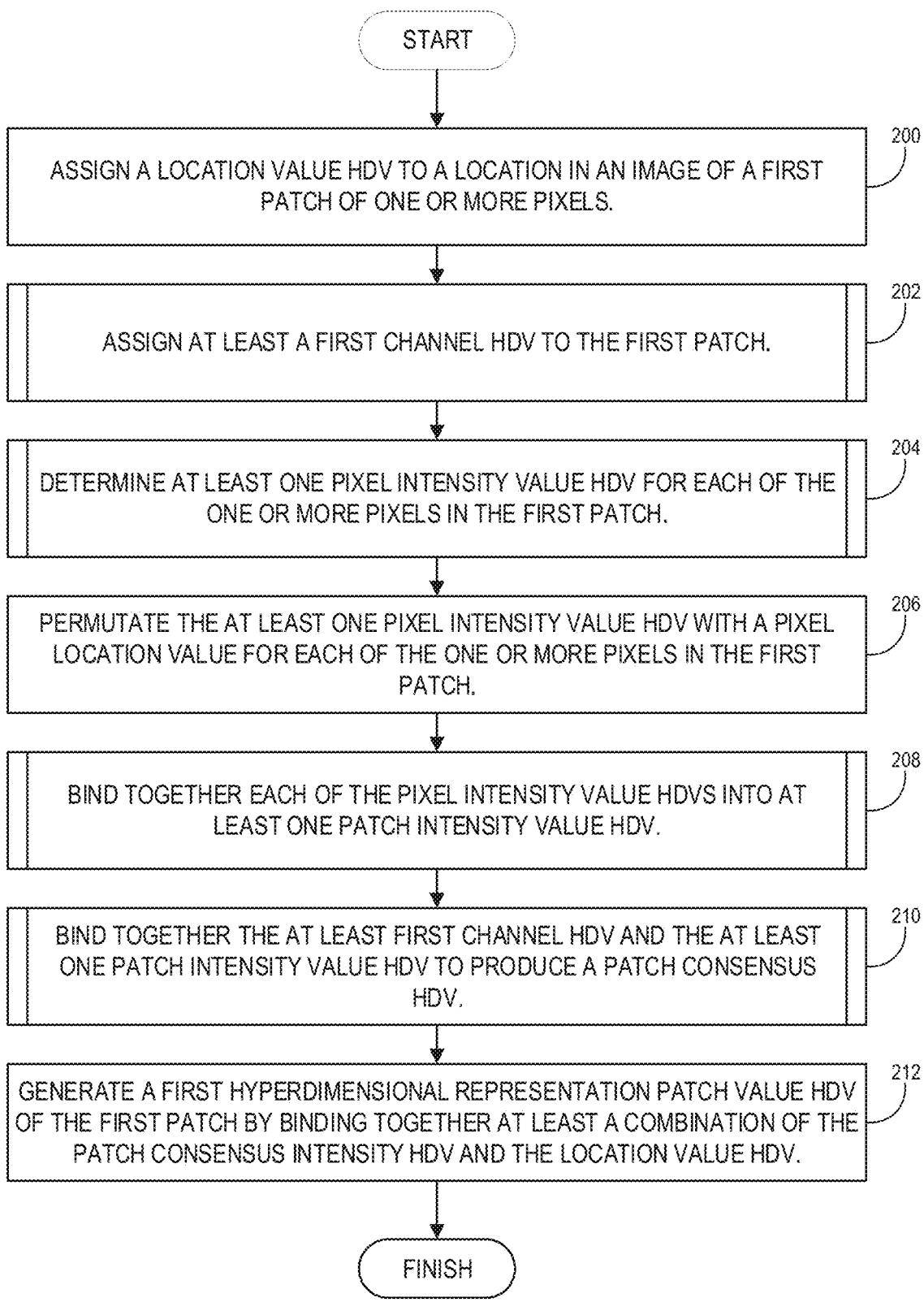
FIG. 2 is a flowchart representative of example machine readable instructions that may be executed by example processor circuitry to implement a robust response to adversarial perturbations using hyperdimensional vectors.

A flowchart representative of example hardware logic circuitry, machine readable instructions, hardware implemented state machines, and/or any combination thereof for implementing the apparatus and system of FIG. 1 is shown in FIG. 2. The machine readable instructions may be one or more executable programs or portion(s) of an executable program for execution by processor circuitry, such as the processor circuitry 412 shown in the example processor platform 1100 discussed below in connection with FIG. 11 and/or the example processor circuitry discussed below in connection with FIGS. 10 and/or 11. The program may be embodied in software stored on one or more non-transitory computer readable storage media such as a CD, a floppy disk, a hard disk drive (HDD), a DVD, a Blu-ray disk, a volatile memory (e.g., Random Access Memory (RAM) of any type, etc.), or a non-volatile memory (e.g., FLASH memory, an HDD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN) gateway that may facilitate communication between a server and an endpoint client hardware device). Similarly, the non-transitory computer readable storage media may include one or more mediums located in one or more hardware devices. Further, although the example program is described with reference to the flowchart illustrated in FIG. 11, many other methods of implementing the example apparatus of FIG. 1 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 2 through 8 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 2 is a flowchart representative of example machine readable instructions that may be executed by example processor circuitry to implement a robust response to adversarial perturbations using hyperdimensional vectors. The process flow is performed by the hyperdimensional vector encoder circuitry 104 and the seeder circuitry 120 as illustrated in FIG. 1.

In the illustrated example of FIG. 2, when an image is received by the hyperdimensional vector encoder circuitry 104 the process begins, at block 200, where the seeder circuitry 120 assigns a location value HDV to a location in the received image of a first patch of one or more pixels.

The example process continues at block 202 when the seeder circuitry 120 assigns at least a first channel HDV to the first patch.

The example process continues at block 204 when the seeder circuitry 120 determines at least one pixel intensity value HDV for each of the one or more pixels in the first patch.

The example process continues at block 206 when the permutater circuitry 116 permutates the at least one pixel intensity value HDV with a pixel location value for each of the one or more pixels in the first patch.

The example process continues at block 208 when the binder circuitry 114 binds together each of the pixel intensity value HDVs into at least one patch intensity value HDV.

The example process continues at block 210 when the binder circuitry 114 binds together the at least first channel HDV and the at least one patch intensity value HDV to produce a patch consensus intensity HDV.

The example process continues at block 212 when the binder circuitry 114 generates a first hyperdimensional representation patch value HDV of the first patch by binding together at least a combination of the patch consensus intensity HDV and the location value HDV. At this point the process flow of FIG. 2 is finished.

Figure 3:
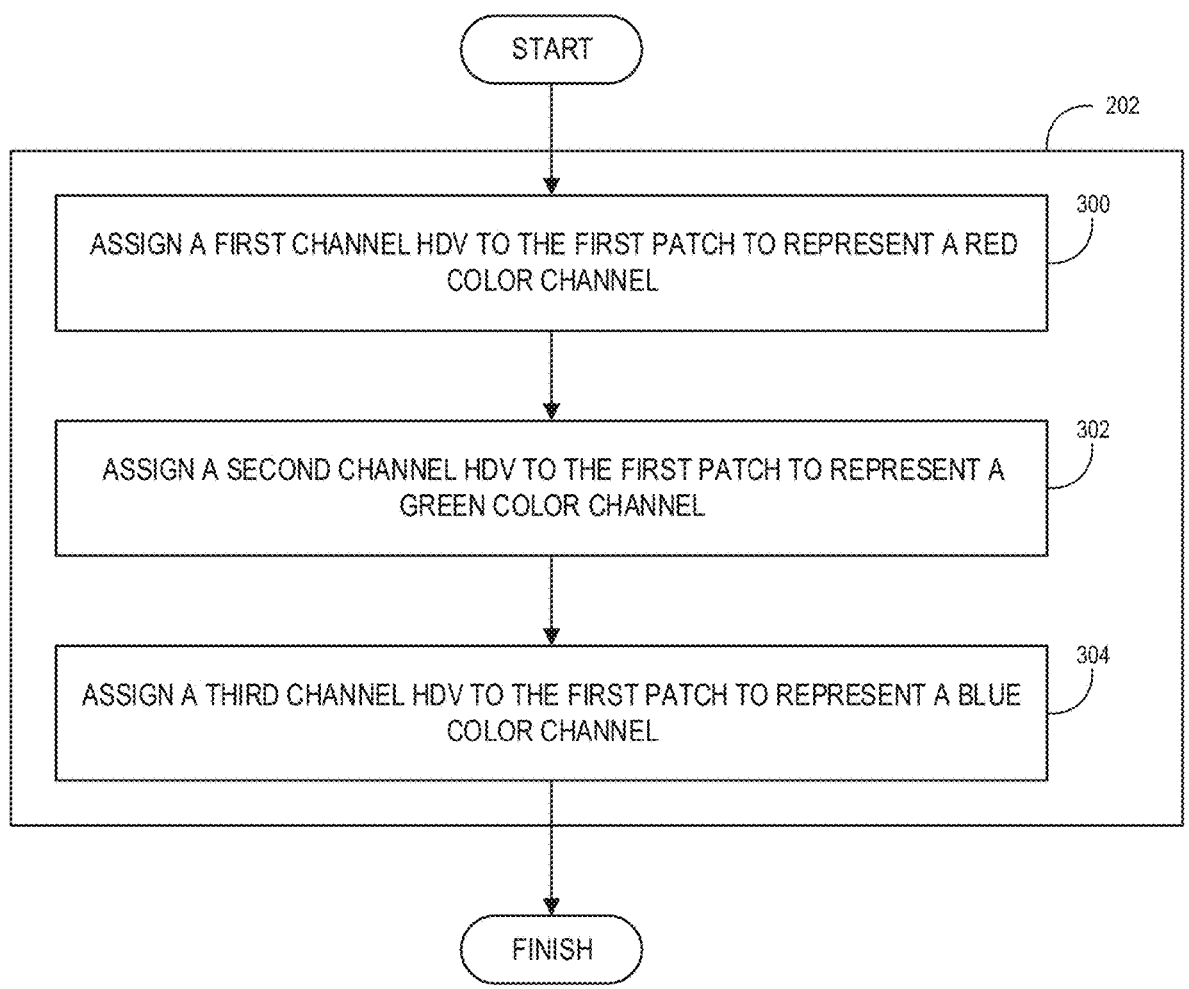
FIG. 3 is a flowchart representative of example machine readable instructions that may be executed by example processor circuitry to implement an example subroutine process flow for further assignments of channel intensity HDVs.

FIG. 3 is a flowchart representative of example machine readable instructions that may be executed by example processor circuitry to implement an example subroutine process flow for further assignments of channel intensity HDVs. While the process flow from FIG. 2 included block 202 that described assigning at least one channel intensity HDV, the subroutine in FIG. 3 expands upon the flow. The process flow in FIG. 3 is performed by the seeder circuitry 120 as illustrated in FIG. 1.

In the illustrated example of FIG. 3, the process begins at block 300 when the seeder circuitry 120 assigns a first channel intensity HDV to the first patch to represent a red color channel.

The example process continues at block 302 when the seeder circuitry 120 assigns a second channel intensity HDV to the first patch to represent a green color channel.

The example process continues at block 304 when the seeder circuitry 120 assigns a third channel intensity HDV to the first patch to represent a blue color channel. At this point the process flow of FIG. 3 is finished.

Figure 4:
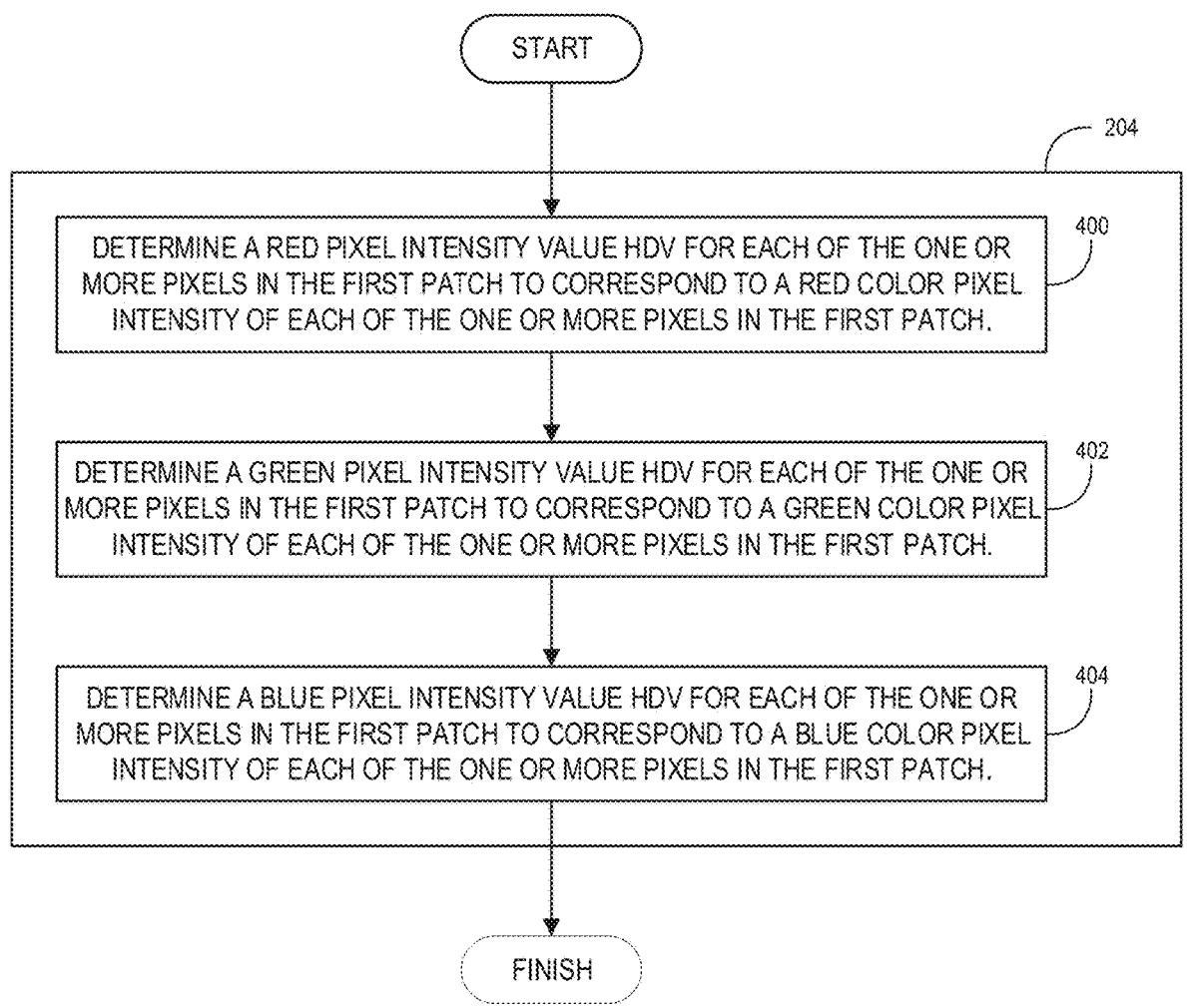
FIG. 4 is a flowchart representative of example machine readable instructions that may be executed by example processor circuitry to implement an example subroutine process flow for further determinations of color pixel intensity value HDVs.

FIG. 4 is a flowchart representative of example machine readable instructions that may be executed by example processor circuitry to implement an example subroutine process flow for further determinations of color pixel intensity value HDVs. While the process flow from FIG. 2 included block 204 that described determining at least one pixel intensity value HDV for each of the one or more pixels in the first patch, the process flow of FIG. 4 further expands block 204. The process flow in FIG. 4 is performed by the seeder circuitry 120 as illustrated in FIG. 1.

In the illustrated example of FIG. 4, the process begins at block 400 when the seeder circuitry 120 determines a red pixel intensity value HDV for each of the one or more pixels in the first patch to correspond to a red color pixel intensity of each of the one or more pixels in the first patch.

The example process continues at block 402 when the seeder circuitry 120 determines a green pixel intensity value HDV for each of the one or more pixels in the first patch to correspond to a green color pixel intensity of each of the one or more pixels in the first patch.

The example process continues at block 404 when the seeder circuitry 120 determines a blue pixel intensity value HDV for each of the one or more pixels in the first patch to correspond to a blue color pixel intensity of each of the one or more pixels in the first patch. At this point the process flow of FIG. 4 is finished.

Figure 5:
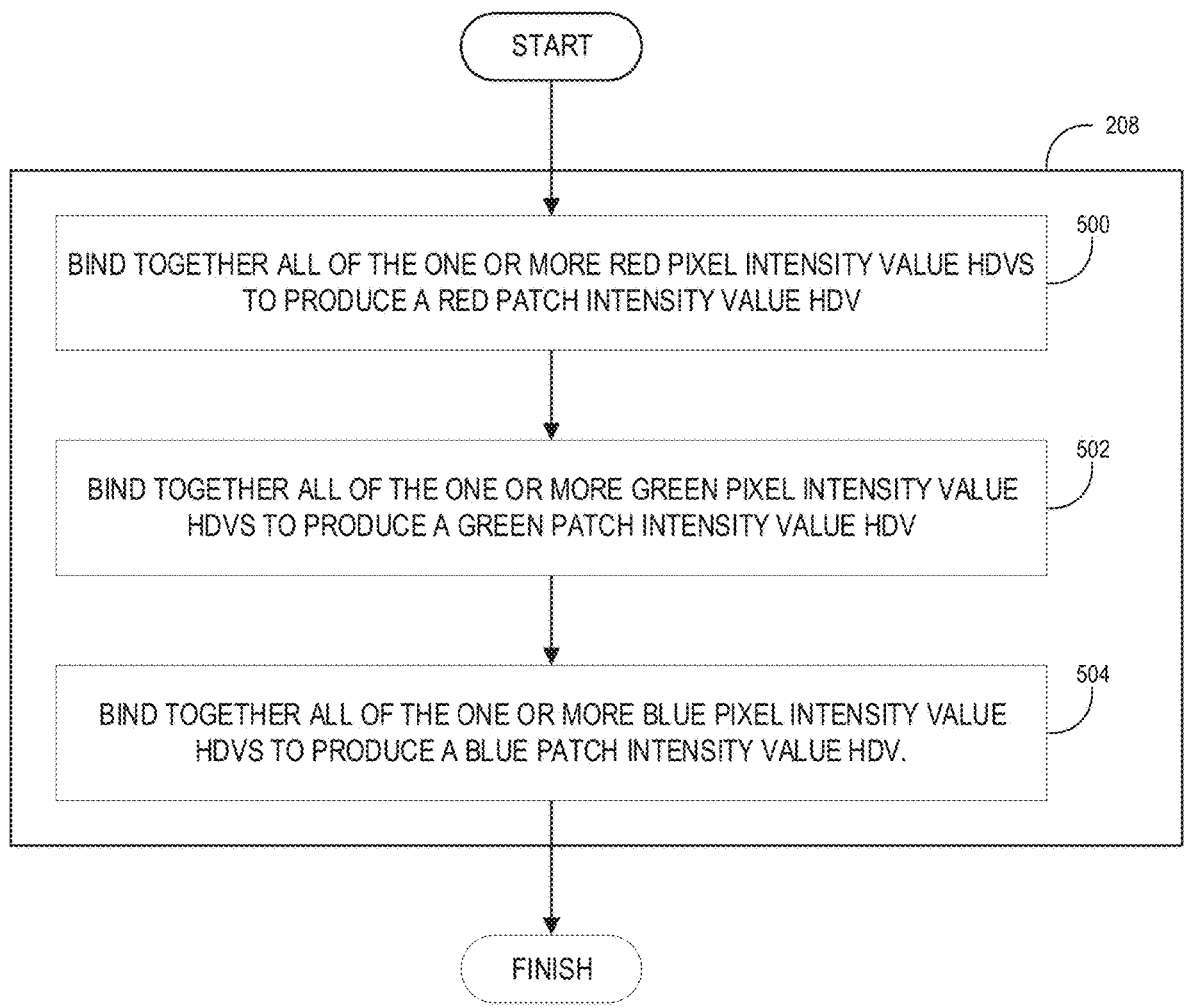
FIG. 5 is a flowchart representative of example machine readable instructions that may be executed by example processor circuitry to implement an example subroutine process flow for further bindings of color pixel intensity value HDVs into color patch intensity value HDVs.

FIG. 5 is a flowchart representative of example machine readable instructions that may be executed by example processor circuitry to implement an example subroutine process flow for further bindings of color pixel intensity value HDVs into color patch intensity value HDVs. While the process flow from FIG. 2 included block 208 that described binding together each of the pixel intensity value HDVs into at least one patch intensity value HDV, the process flow of FIG. 5 further expands block 208. The process flow in FIG. 5 is performed by the binder circuitry 114 as illustrated in FIG. 1.

In the illustrated example of FIG. 5, the process begins at block 500 when the binder circuitry 114 binds together all of the one or more red pixel intensity value HDVs to produce a red patch intensity value HDV.

The example process continues at block 502 when the binder circuitry 114 binds together all of the one or more green pixel intensity value HDVs to produce a green patch intensity value HDV.

The example process continues at block 504 when the binder circuitry 114 binds together all of the one or more blue pixel intensity value HDVs to produce a blue patch intensity value HDV. At this point the process flow of FIG. 5 is finished.

In alternative examples, less than all of the pixel intensity value HDVs are bound together by the binder circuitry 114 E.g., less than all of the pixel intensity value HDVs are bound together per red, green, blue color and/or a different number of pixel intensity value HDVs are bound together when comparing the numbers for each of the three colors.

Figure 6:
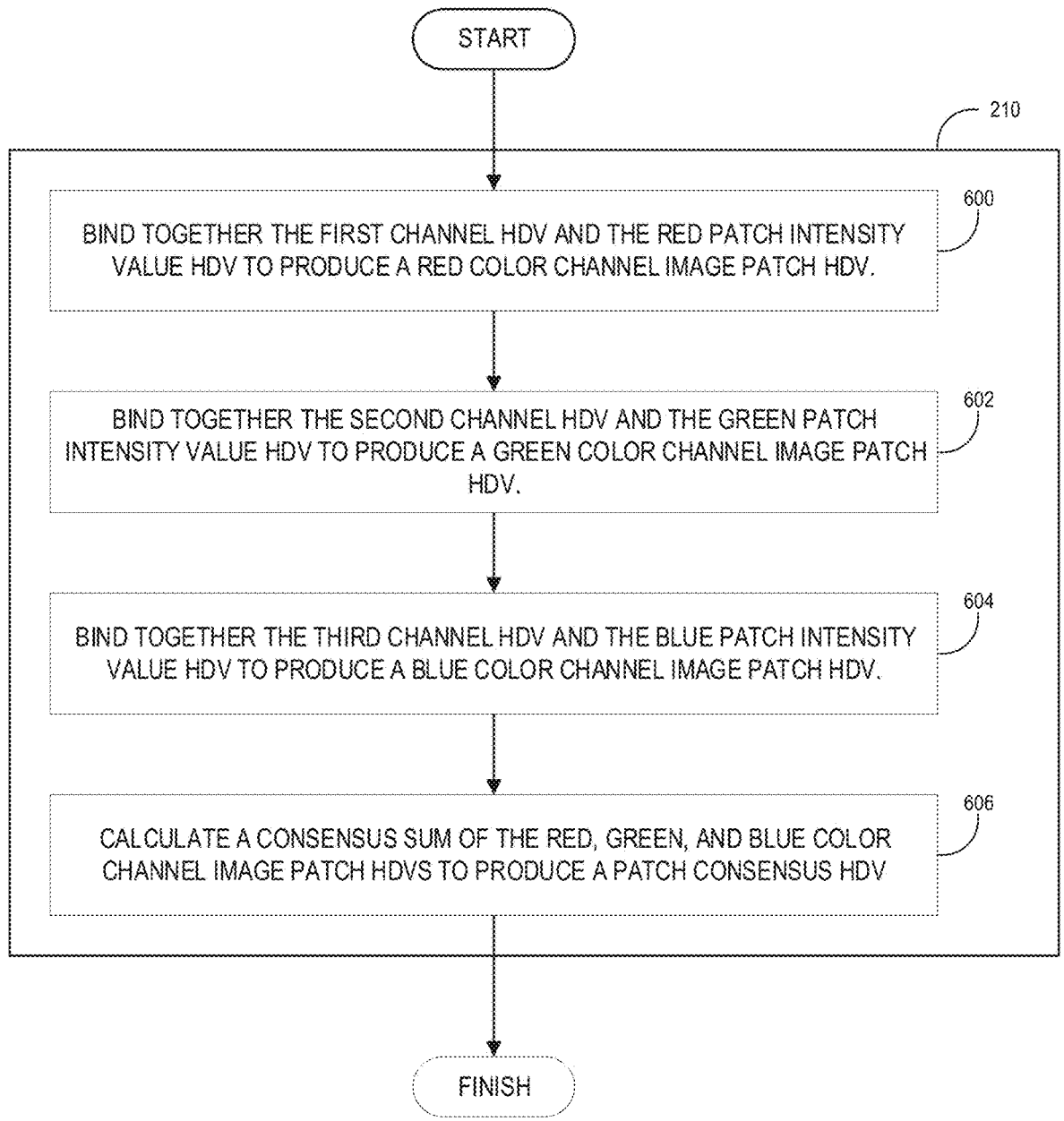
FIG. 6 is a flowchart representative of example machine readable instructions that may be executed by example processor circuitry to implement an example subroutine process flow for further bindings of channel HDVs with patch intensity HDVs into color channel image patch HDVs.

FIG. 6 is a flowchart representative of example machine readable instructions that may be executed by example processor circuitry to implement an example subroutine process flow for further bindings of channel HDVs with patch intensity HDVs into color channel image patch HDVs. While the process flow from FIG. 2 included block 210 that described binding together the at least first channel HDV and the at least one patch intensity value HDV to produce a consensus patch HDV, the process flow of FIG. 6 further expands block 210. The process flow in FIG. 6 is performed by the encoder circuitry 104 as illustrated in FIG. 1.

In the illustrated example of FIG. 6, the process begins at block 600 when the binder circuitry 114 binds together the first channel HDV and the red patch intensity value HDV to produce a red color channel image patch HDV.

The example process continues at block 602 when the binder circuitry 114 binds together the second channel HDV and the green patch intensity value HDV to produce a green color channel image patch HDV.

The example process continues at block 604 when the binder circuitry 114 binds together the third channel HDV and the blue patch intensity value HDV to produce a blue color channel image patch HDV.

The example process continues at block 606 when the consensus sum adder circuitry 118 calculates a consensus sum of the red, green, and blue color channel image patch HDVs to produce a patch consensus HDV. At this point the process flow of FIG. 6 is finished.

Figure 7:
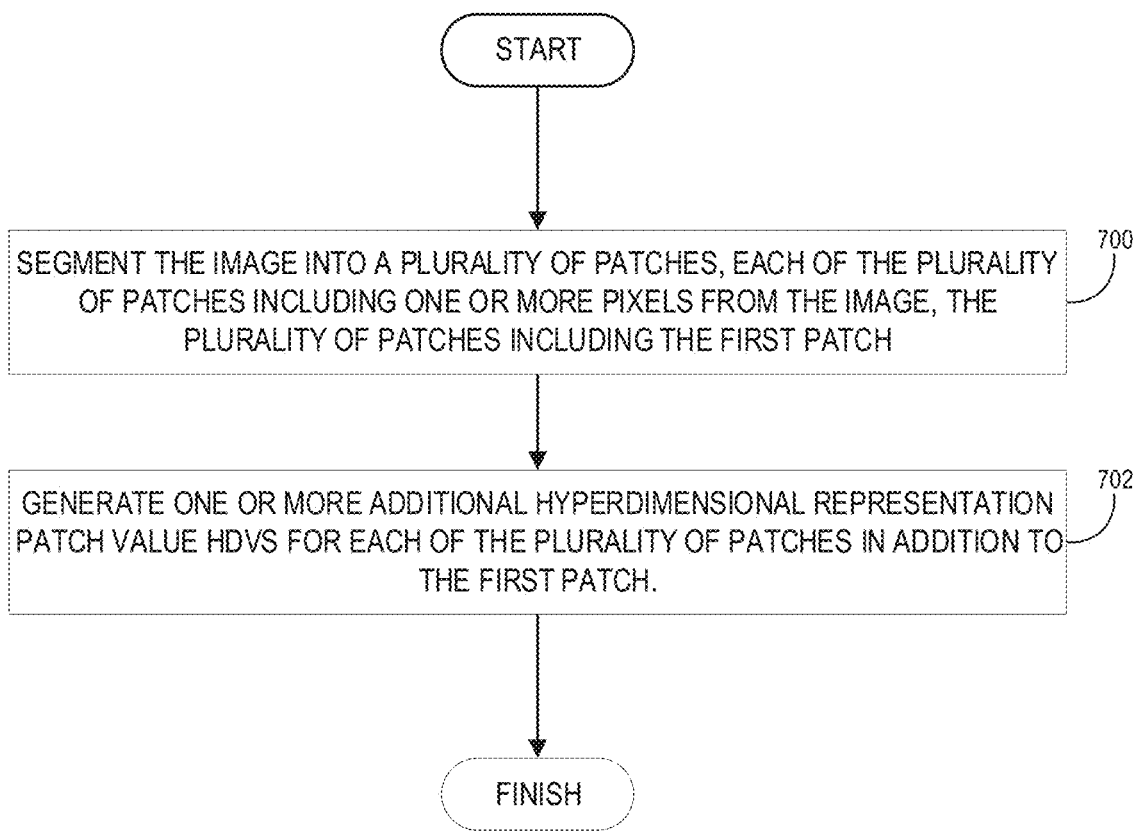
FIG. 7 is a flowchart representative of example machine readable instructions that may be executed by example processor circuitry to implement an example process flow to segment an image into patches and generate hyperdimensional representation value HDVs of those patches.

FIG. 7 is a flowchart representative of example machine readable instructions that may be executed by example processor circuitry to implement an example process flow to segment an image into patches and generate hyperdimensional representation value HDVs of those patches. The process flow in FIG. 7 is performed by the encoder circuitry 104 and seeder circuitry 112 as illustrated in FIG. 1.

In the illustrated example of FIG. 7, the process begins at block 700 when the seeder circuitry 112 segments the image into a plurality of patches. Each of the patches include one or more pixels from the image. The plurality of patches includes the first patch. In some examples, the size of each patch can be from 1 pixel to n pixels, where n pixels is the number of pixels in the image. For example, there may be 8 patches, 64 patches, 256 patches, or any other number of patches that have been segmented/partitioned from the full image.

The example process continues at block 702 when the encoder circuitry 104 generates one or more additional hyperdimensional representation patch value HDVs for each of the plurality of patches in addition to the first patch. In some examples, the encoder circuitry 104 replicates the process flow blocks that have been performed for the first patch for the remaining patches segmented from the image. At this point the process flow of FIG. 7 is finished.

Figure 8:
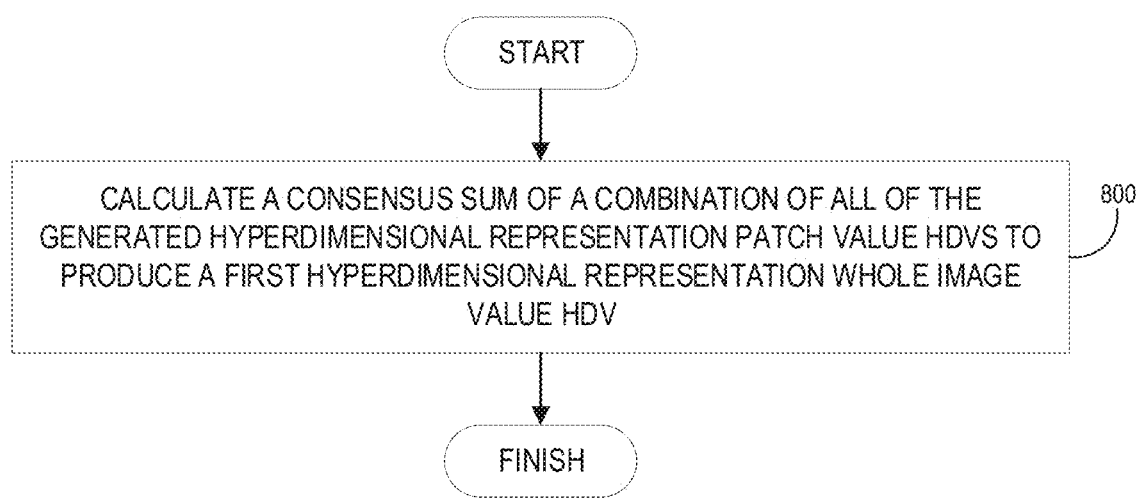
FIG. 8 is a flowchart representative of example machine readable instructions that may be executed by example processor circuitry to implement producing a first hyperdimensional representation whole image value HDV.

FIG. 8 is a flowchart representative of example machine readable instructions that may be executed by example processor circuitry to implement producing a first hyperdimensional representation whole image value HDV. The process flow in FIG. 8 is performed by the consensus sum adder circuitry 118 as illustrated in FIG. 1.

In the illustrated example of FIG. 8, the process begins at block 800 when the consensus sum adder circuitry 118 calculates a consensus sum of a combination of all the generated hyperdimensional representation patch value HDVs to produce a first hyperdimensional representation whole image value HDV. In some examples, the hyperdimensional representation whole image value HDV is then sent to the CNN 106 in FIG. 1 for training or classification, depending on whether the image was an original or not. At this point the process flow of FIG. 8 is finished.

Figure 9:
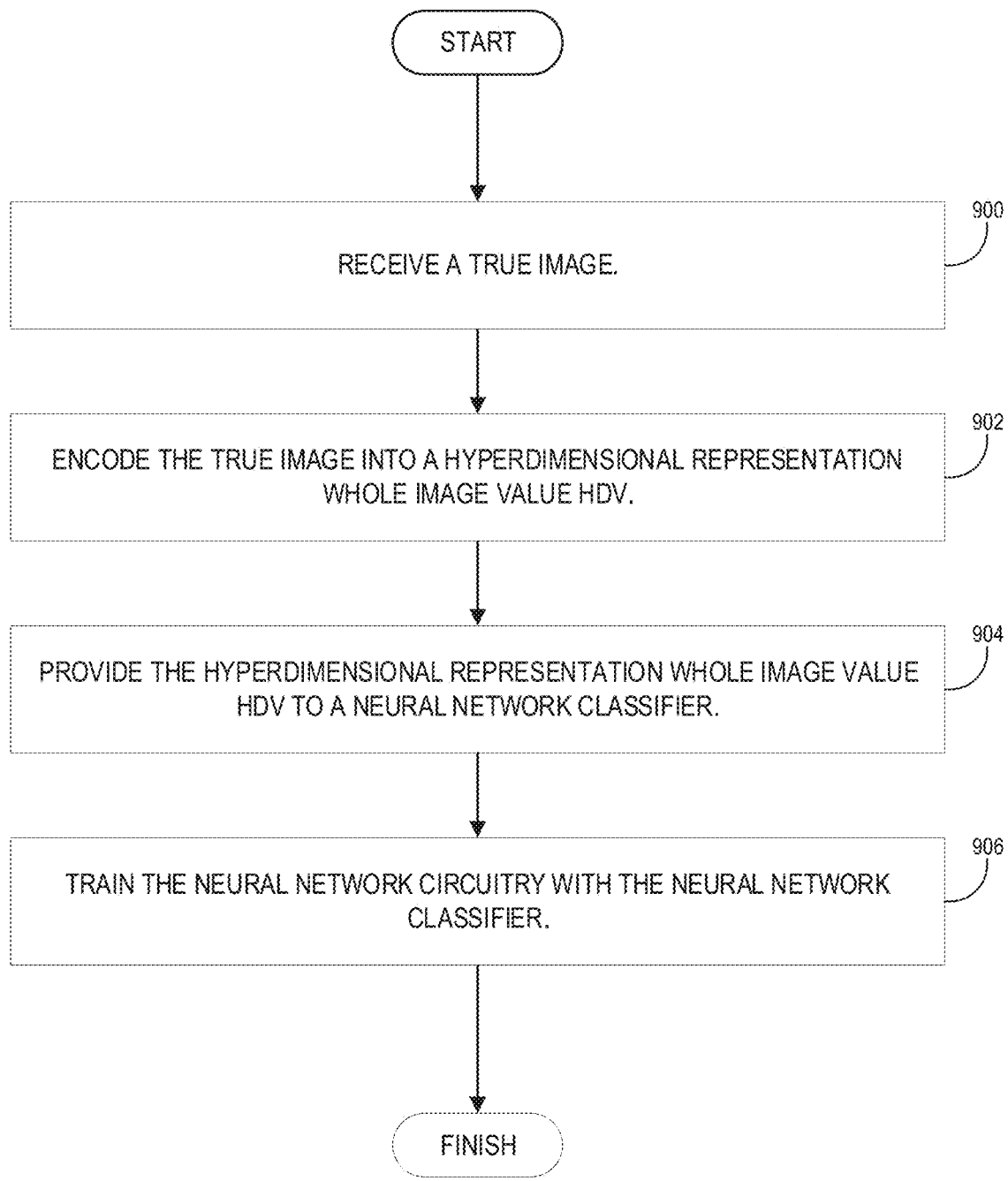
FIG. 9 is a flowchart representative of example machine readable instructions that may be executed by example processor circuitry to implement training a neural network from a hyperdimensional representation whole image value HDV.

FIG. 9 is a flowchart representative of example machine readable instructions that may be executed by example processor circuitry to implement training a neural network from a hyperdimensional representation whole image value HDV. The process flow in FIG. 9 is performed by elements of the CNN circuitry 106 as illustrated in FIG. 1.

In the illustrated example of FIG. 9, the process begins at block 900 when the CNN filter circuitry 104B receives a true image. A true image is an original image. In some examples, the true image 100 is verified/authenticated as original in one or more known ways of authentication and/or verification. The start of the process in FIG. 9 is triggered/initiated by pro The example process continues at block 902 when the CNN filter circuitry 104B encodes the true image 100 into a hyperdimensional representation whole image value HDV.

The example process continues at block 904 when the CNN filter circuitry 104B provides the hyperdimensional representation whole image value HDV to a neural network classifier.

The example process continues at block 906 when the CNN trainer circuitry 106B trains the CNN circuitry 106 with the neural network classifier. In some examples, the CNN circuitry 106 uses any known training heuristic to train the neural network on classifying the true image using the hyperdimensional representation whole image value HDV. At this point the process flow of FIG. 9 is done.

Figure 10:
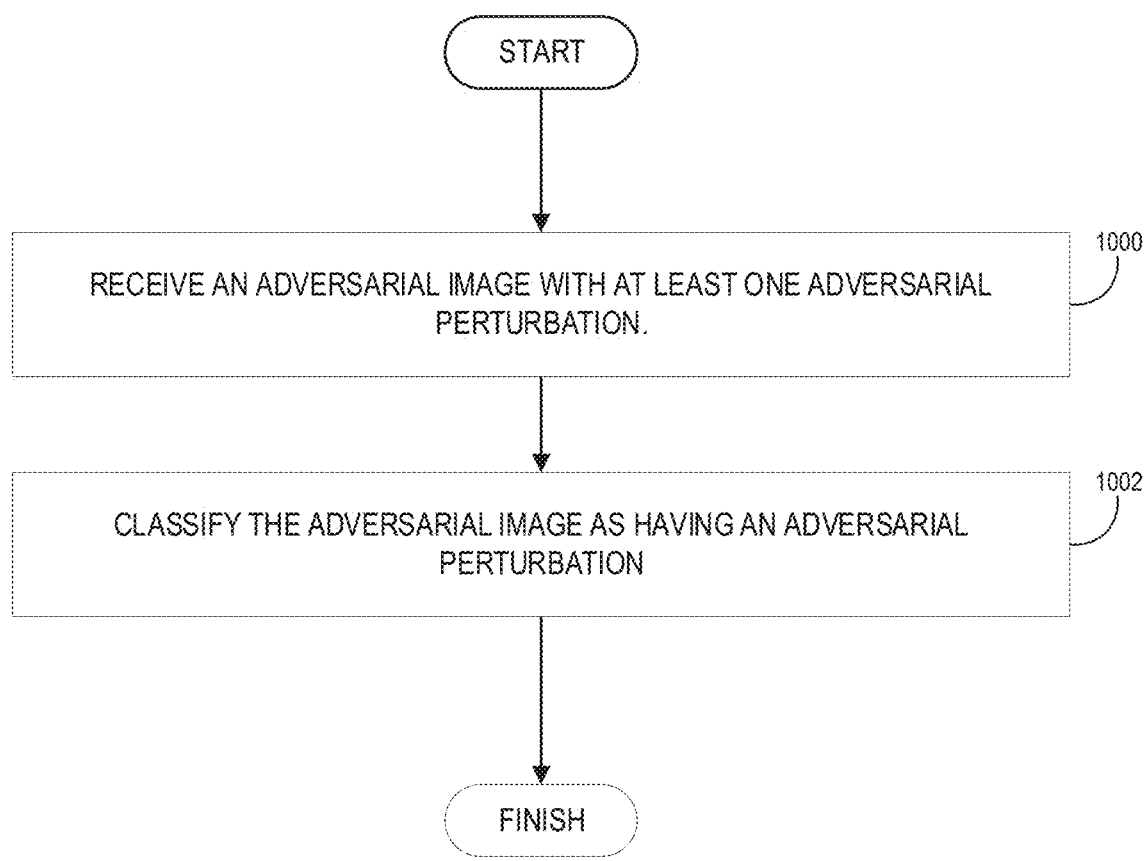
FIG. 10 is a flowchart representative of example machine readable instructions that may be executed by example processor circuitry to implement classifying an adversarial image with at least one adversarial perturbation.

FIG. 10 is a flowchart representative of example machine readable instructions that may be executed by example processor circuitry to implement classifying an adversarial image with at least one adversarial perturbation. The process flow in FIG. 10 is performed by elements of the CNN circuitry 106 as illustrated in FIG. 1.

In the illustrated example of FIG. 10, the process begins at block 1000 when the CNN filter circuitry 104B receives an adversarial image with at least one adversarial perturbation.

Figure 11:
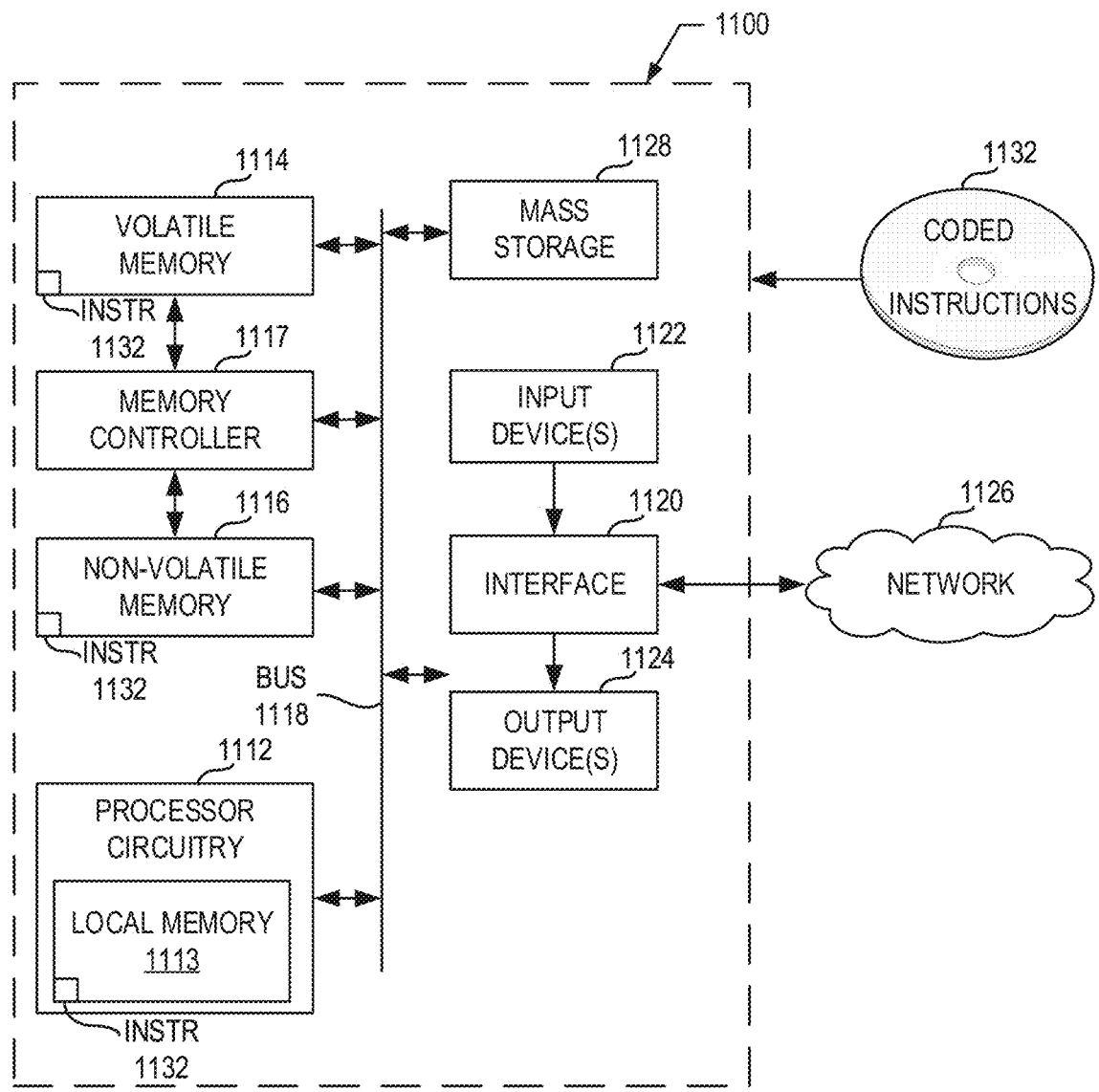
FIG. 11 is a block diagram of an example processing platform including processor circuitry structured to execute the example machine readable instructions of FIG. 2 to implement an example system architecture that utilizes hyperdimensional vectors (HDVs) to respond robustly to adversarial perturbations.

The example process continues at block 1002 when the CNN classifier circuitry 106C classifies the adversarial image as having at least one adversarial perturbation. At this point the process flow of FIG. 10 is done FIG. 11 is a block diagram of an example processor platform 1100 structured to execute and/or instantiate the machine readable instructions and/or operations of FIGS. 2 through 10 to implement the apparatus of FIG. 1. The processor platform 1100 can be, for example, a server, a personal computer, a workstation, a self-learning machine (e.g., a neural network), a mobile device (e.g., a cell phone, a smart phone, a tablet such as an iPad™), an Internet appliance, a DVD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 1100 of the illustrated example includes processor circuitry 1112. The processor circuitry 1112 of the illustrated example is hardware. For example, the processor circuitry 1112 can be implemented by one or more integrated circuits, logic circuits, FPGAs microprocessors, CPUs, GPUs, DSPs, and/or microcontrollers from any desired family or manufacturer. The processor circuitry 1112 may be implemented by one or more semiconductor based (e.g., silicon based) devices. In this example, the processor circuitry 1112 implements the example hyperdimensional vector encoder circuitry 104, the example binder circuitry 114, the example permuter circuitry 116, the example consensus sum adder circuitry 118, and the example seeder circuitry 120.

The processor circuitry 1112 of the illustrated example includes a local memory 1113 (e.g., a cache, registers, etc.). The processor circuitry 1112 of the illustrated example is in communication with a main memory including a volatile memory 1114 and a non-volatile memory 1116 by a bus 1118. The volatile memory 1114 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1116 may be implemented by flash memory and/or any other desired type of memory device. Access to the main memory 1114, 1116 of the illustrated example is controlled by a memory controller 1117.

The processor platform 1100 of the illustrated example also includes interface circuitry 1120. The interface circuitry 1120 may be implemented by hardware in accordance with any type of interface standard, such as an Ethernet interface, a universal serial bus (USB) interface, a Bluetooth® interface, a near field communication (NFC) interface, a PCI interface, and/or a PCIe interface.

In the illustrated example, one or more input devices 1122 are connected to the interface circuitry 1120. The input device(s) 1122 permit(s) a user to enter data and/or commands into the processor circuitry 1112. The input device(s) 1122 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1124 are also connected to the interface circuitry 1120 of the illustrated example. The output devices 1124 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1120 of the illustrated example, thus, typically includes a graphics driver card, a graphics driver chip, and/or graphics processor circuitry such as a GPU.

The interface circuitry 1120 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1126. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1100 of the illustrated example also includes one or more mass storage devices 1128 to store software and/or data. Examples of such mass storage devices 1128 include magnetic storage devices, optical storage devices, floppy disk drives, HDDs, CDs, Blu-ray disk drives, redundant array of independent disks (RAID) systems, solid state storage devices such as flash memory devices, and DVD drives.

The machine executable instructions 1132, which may be implemented by the machine readable instructions of FIGS. 2 through 10, may be stored in the mass storage device 1128, in the volatile memory 1114, in the non-volatile memory 1116, and/or on a removable non-transitory computer readable storage medium such as a CD or DVD.

Figure 12:
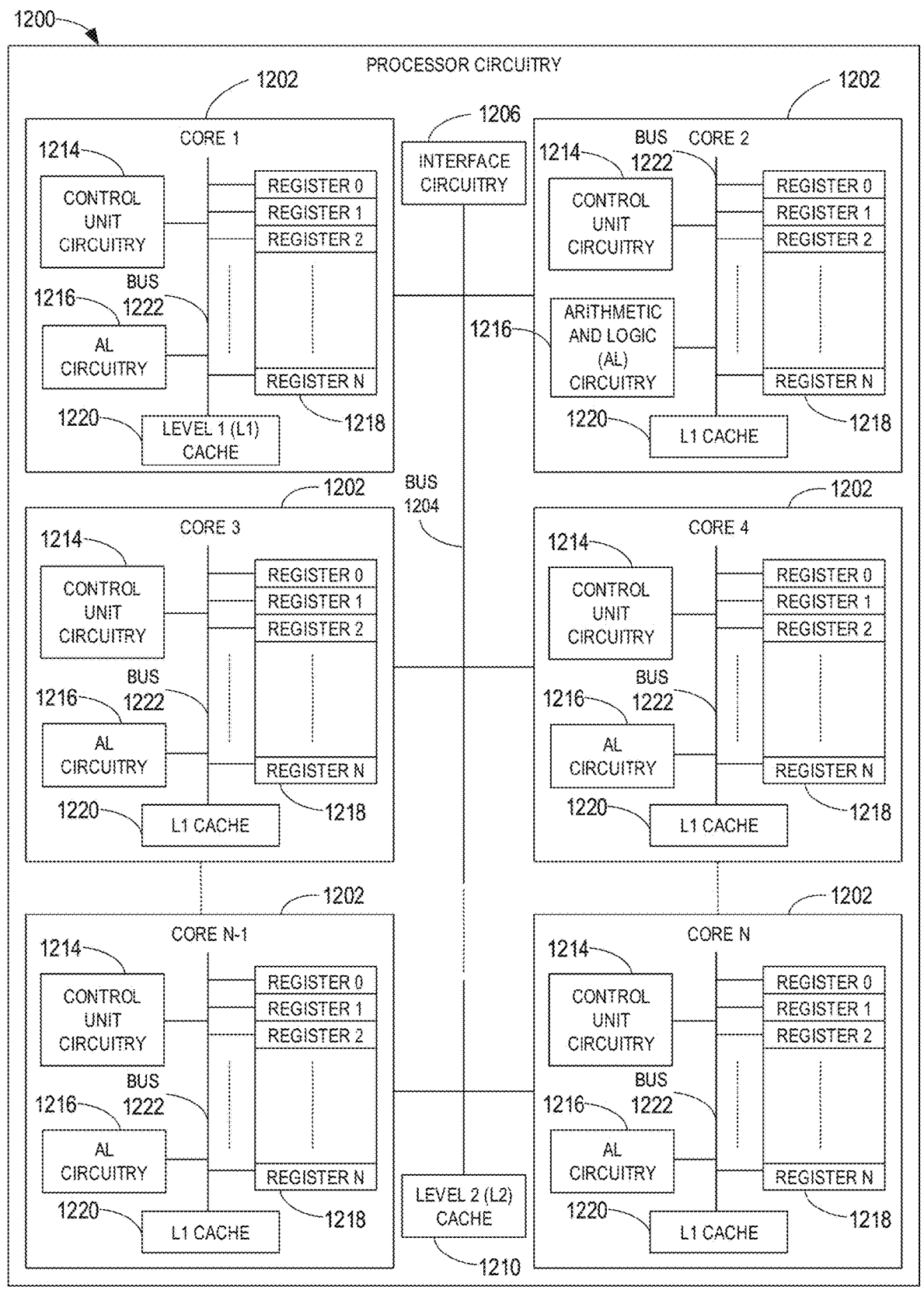
FIG. 12 is a block diagram of an example implementation of the processor circuitry of FIG. 11.

FIG. 12 is a block diagram of an example implementation of the processor circuitry 1112 of FIG. 11. In this example, the processor circuitry 1112 of FIG. 11 is implemented by a microprocessor 1200. For example, the microprocessor 1200 may implement multi-core hardware circuitry such as a CPU, a DSP, a GPU, an XPU, etc. Although it may include any number of example cores 1202 (e.g., 1 core), the microprocessor 1200 of this example is a multi-core semiconductor device including N cores. The cores 1202 of the microprocessor 1200 may operate independently or may cooperate to execute machine readable instructions. For example, machine code corresponding to a firmware program, an embedded software program, or a software program may be executed by one of the cores 1202 or may be executed by multiple ones of the cores 1202 at the same or different times. In some examples, the machine code corresponding to the firmware program, the embedded software program, or the software program is split into threads and executed in parallel by two or more of the cores 1202. The software program may correspond to a portion or all of the machine readable instructions and/or operations represented by the flowchart of FIGS. 2 through 10.

The cores 1202 may communicate by an example bus 1204. In some examples, the bus 1204 may implement a communication bus to effectuate communication associated with one(s) of the cores 1202. For example, the bus 1204 may implement at least one of an Inter-Integrated Circuit (I2C) bus, a Serial Peripheral Interface (SPI) bus, a PCI bus, or a PCIe bus. Additionally or alternatively, the bus 1204 may implement any other type of computing or electrical bus. The cores 1202 may obtain data, instructions, and/or signals from one or more external devices by example interface circuitry 1206. The cores 1202 may output data, instructions, and/or signals to the one or more external devices by the interface circuitry 1206. Although the cores 1202 of this example include example local memory 1220 (e.g., Level 1 (L1) cache that may be split into an L1 data cache and an L1 instruction cache), the microprocessor 1200 also includes example shared memory 1210 that may be shared by the cores (e.g., Level 2 (L2_cache)) for high-speed access to data and/or instructions. Data and/or instructions may be transferred (e.g., shared) by writing to and/or reading from the shared memory 1210. The local memory 1220 of each of the cores 1202 and the shared memory 1210 may be part of a hierarchy of storage devices including multiple levels of cache memory and the main memory (e.g., the main memory 1214, 1216 of FIG. 12). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1202 may be referred to as a CPU, DSP, GPU, etc., or any other type of hardware circuitry. Each core 1202 includes control unit circuitry 1214, arithmetic and logic (AL) circuitry (sometimes referred to as an ALU) 1216, a plurality of registers 1218, the L1 cache 1220, and an example bus 1222. Other structures may be present. For example, each core 1202 may include vector unit circuitry, single instruction multiple data (SIMD) unit circuitry, load/store unit (LSU) circuitry, branch/jump unit circuitry, floating-point unit (FPU) circuitry, etc. The control unit circuitry 1214 includes semiconductor-based circuits structured to control (e.g., coordinate) data movement within the corresponding core 1202. The AL circuitry 1216 includes semiconductor-based circuits structured to perform one or more mathematic and/or logic operations on the data within the corresponding core 1202. The AL circuitry 1216 of some examples performs integer based operations. In other examples, the AL circuitry 1216 also performs floating point operations. In yet other examples, the AL circuitry 1216 may include first AL circuitry that performs integer based operations and second AL circuitry that performs floating point operations. In some examples, the AL circuitry 1216 may be referred to as an Arithmetic Logic Unit (ALU). The registers 1218 are semiconductor-based structures to store data and/or instructions such as results of one or more of the operations performed by the AL circuitry 1216 of the corresponding core 1202. For example, the registers 1218 may include vector register(s), SIMD register(s), general purpose register(s), flag register(s), segment register(s), machine specific register(s), instruction pointer register(s), control register(s), debug register(s), memory management register(s), machine check register(s), etc. The registers 1218 may be arranged in a bank as shown in FIG. 12. Alternatively, the registers 1218 may be organized in any other arrangement, format, or structure including distributed throughout the core 1202 to shorten access time. The bus 1220 may implement at least one of an I2C bus, a SPI bus, a PCI bus, or a PCIe bus Each core 1202 and/or, more generally, the microprocessor 1200 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1200 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 13:
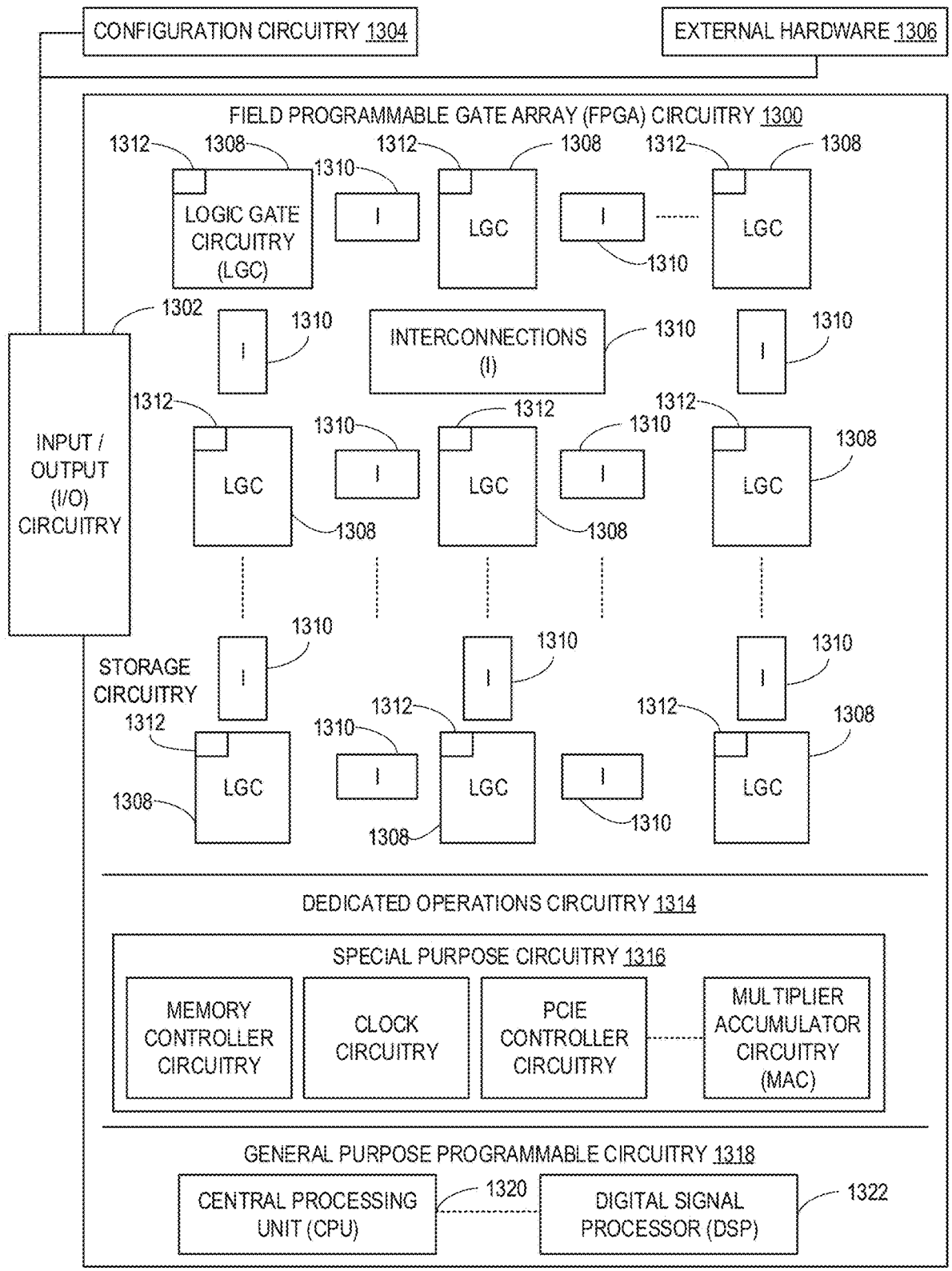
FIG. 13 is a block diagram of another example implementation of the processor circuitry of FIG. 11.

FIG. 13 is a block diagram of another example implementation of the processor circuitry 1112 of FIG. 11. In this example, the processor circuitry 1200 is implemented by FPGA circuitry 1300. The FPGA circuitry 1300 can be used, for example, to perform operations that could otherwise be performed by the example microprocessor 1200 of FIG. 12 executing corresponding machine readable instructions. However, once configured, the FPGA circuitry 1300 instantiates the machine readable instructions in hardware and, thus, can often execute the operations faster than they could be performed by a general purpose microprocessor executing the corresponding software.

More specifically, in contrast to the microprocessor 1200 of FIG. 12 described above (which is a general purpose device that may be programmed to execute some or all of the machine readable instructions represented by the flowcharts of FIG. 2 through 10 but whose interconnections and logic circuitry are fixed once fabricated), the FPGA circuitry 1300 of the example of FIG. 13 includes interconnections and logic circuitry that may be configured and/or interconnected in different ways after fabrication to instantiate, for example, some or all of the machine readable instructions represented by the flowchart of FIG. 2. In particular, the FPGA 1300 may be thought of as an array of logic gates, interconnections, and switches. The switches can be programmed to change how the logic gates are interconnected by the interconnections, effectively forming one or more dedicated logic circuits (unless and until the FPGA circuitry 1300 is reprogrammed). The configured logic circuits enable the logic gates to cooperate in different ways to perform different operations on data received by input circuitry. Those operations may correspond to some or all of the software represented by the flowchart of FIG. 2. As such, the FPGA circuitry 1300 may be structured to effectively instantiate some or all of the machine readable instructions of the flowchart of FIG. 2 as dedicated logic circuits to perform the operations corresponding to those software instructions in a dedicated manner analogous to an ASIC. Therefore, the FPGA circuitry 1300 may perform the operations corresponding to the some or all of the machine readable instructions of FIG. 2 faster than the general purpose microprocessor can execute the same.

In the example of FIG. 13, the FPGA circuitry 1300 is structured to be programmed (and/or reprogrammed one or more times) by an end user by a hardware description language (HDL) such as Verilog. The FPGA circuitry 1300 of FIG. 13, includes example input/output (I/O) circuitry 1302 to obtain and/or output data to/from example configuration circuitry 1304 and/or external hardware (e.g., external hardware circuitry) 1306. For example, the configuration circuitry 1304 may implement interface circuitry that may obtain machine readable instructions to configure the FPGA circuitry 1300, or portion(s) thereof. In some such examples, the configuration circuitry 1304 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 1306 may implement the microprocessor 1200 of FIG. 12. The FPGA circuitry 1300 also includes an array of example logic gate circuitry 1308, a plurality of example configurable interconnections 1310, and example storage circuitry 1312. The logic gate circuitry 1308 and interconnections 1310 are configurable to instantiate one or more operations that may correspond to at least some of the machine readable instructions of FIG. 2 and/or other desired operations. The logic gate circuitry 1308 shown in FIG. 13 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1308 to enable configuration of the electrical structures and/or the logic gates to form circuits to perform desired operations. The logic gate circuitry 1308 may include other electrical structures such as look-up tables (LUTs), registers (e.g., flip-flops or latches), multiplexers, etc.

The interconnections 1310 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1308 to program desired logic circuits.

The storage circuitry 1312 of the illustrated example is structured to store result(s) of the one or more of the operations performed by corresponding logic gates. The storage circuitry 1312 may be implemented by registers or the like. In the illustrated example, the storage circuitry 1312 is distributed amongst the logic gate circuitry 1308 to facilitate access and increase execution speed.

The example FPGA circuitry 1300 of FIG. 13 also includes example Dedicated Operations Circuitry 1314. In this example, the Dedicated Operations Circuitry 1314 includes special purpose circuitry 1316 that may be invoked to implement commonly used functions to avoid the need to program those functions in the field. Examples of such special purpose circuitry 1316 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1300 may also include example general purpose programmable circuitry 1318 such as an example CPU 1320 and/or an example DSP 1322. Other general purpose programmable circuitry 1318 may additionally or alternatively be present such as a GPU, an XPU, etc., that can be programmed to perform other operations.

Although FIGS. 12 and 13 illustrate two example implementations of the processor circuitry 1112 of FIG. 11, many other approaches are contemplated. For example, as mentioned above, modern FPGA circuitry may include an on-board CPU, such as one or more of the example CPU 1320 of FIG. 13. Therefore, the processor circuitry 1112 of FIG. 11 may additionally be implemented by combining the example microprocessor 1200 of FIG. 12 and the example FPGA circuitry 1300 of FIG. 13. In some such hybrid examples, a first portion of the machine readable instructions represented by the flowchart of FIG. 2 may be executed by one or more of the cores 1202 of FIG. 12 and a second portion of the machine readable instructions represented by the flowchart of FIG. 3 may be executed by the FPGA circuitry 1300 of FIG. 13.

In some examples, the processor circuitry 1112 of FIG. 11 may be in one or more packages. For example, the processor circuitry 1200 of FIG. 12 and/or the FPGA circuitry 1300 of FIG. 13 may be in one or more packages. In some examples, an XPU may be implemented by the processor circuitry 1112 of FIG. 11, which may be in one or more packages. For example, the XPU may include a CPU in one package, a DSP in another package, a GPU in yet another package, and an FPGA in still yet another package.

From the foregoing, it will be appreciated that example apparatus, methods, and articles of manufacture have been disclosed that improve the ability of artificial neural networks to classify data received accurately, such as image data, when faced with adversarial perturbations in the data.

Figure 14:
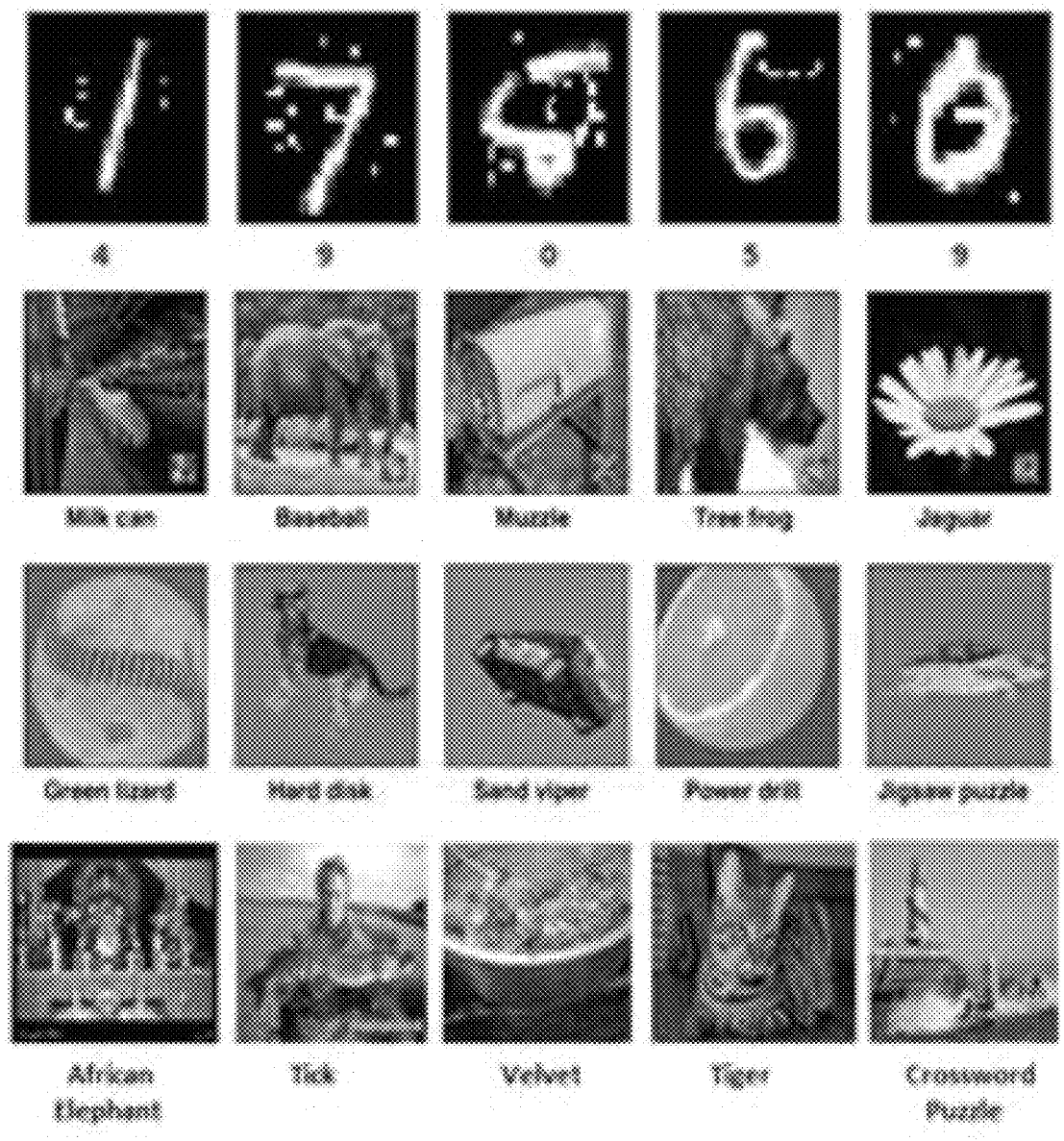
FIG. 14 illustrates a series of example types of adversarial perturbations.

To test training and classification proficiencies on apparatus, methods, and articles of manufacture that have been disclosed for robust response to adversarial perturbations using hyperdimensional vectors, a set of 100 example images was constructed. FIG. 14 illustrates a series of example types of adversarial perturbations. In some examples, adversarial perturbations can be classified in several types. The example images in FIG. 14 were taken from literature covering four different types of the most common adversarial attacks that can "fool" CNNs trained to classify familiar objects. The example images were tested on baseline/standard models used to classify images and then compared to tests performed by the apparatus of FIG. 1.

FIG. 14 illustrates some of these example images with labels indicating an example standard model's classifications.

In the illustrated example, the first row shows examples of digit images from the MNIST dataset that are corrupted with adversarial noise. The adversarial noise can cause an example standard machine to classify one kind of digit as another.

The second row in the illustrated example shows adversarial images due to the LaVAN attack that can cause a machine to misclassify a natural image even if the noise is localized to a corner of the image. The lower right corner of the example images in the second show the small portions of noise.

The third row in the illustrated example corresponds to "Robust" adversarial images. In some examples, these are renderings of 3D objects that are misclassified from multiple viewpoints (and can even be physically produced in the real world).

The last row in the illustrated example corresponds to adversarial images due to a wide range of attacks based on statistical manipulation of pixel intensities to fool a machine learning model. This last row has examples from several well-known attacks. The illustrated set of examples was chosen to determine if the testing approach was model-agnostic, meaning it can be used to improve robustness irrespective of the type of attack or modifying the classification model.

In a first example experiment with the encoder 104 circuitry described in FIG. 1, the 100 examples in the adversarial image dataset described above were used.

Figure 15:
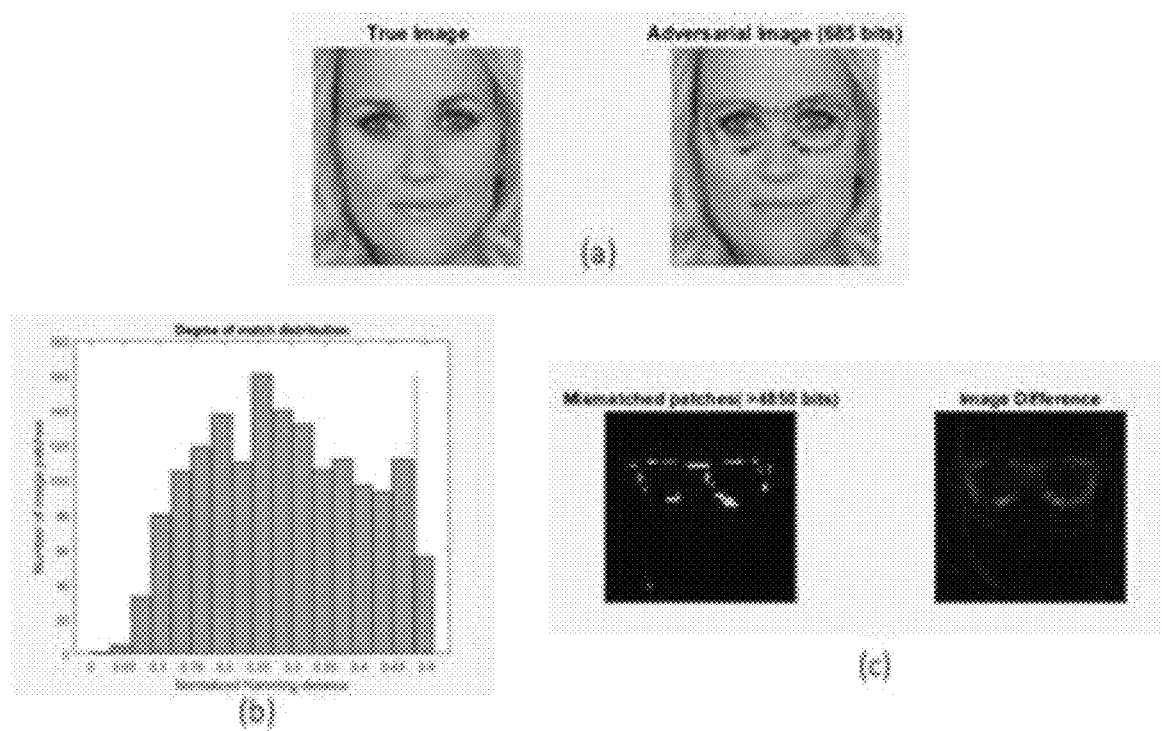
FIG. 15 illustrates the results of an example comparison of the Hamming distances of true and adversarial images.

FIG. 15 illustrates the results of an example comparison of the Hamming distances of true and adversarial images. More specifically, FIG. 15(*a*) illustrates an example of one of the true images shown next to an example of a corresponding adversarial image used in the first example experiment. FIG. 15(*b*) illustrates an example normalized Hamming distance between corresponding patches of the two images. FIG. 15(*c*) illustrates the absolute value of pixel differences in the images.

In the first experiment, a set of segmented colored image patches per image were run through the example encoder 104 for each true image and the Hamming distances between corresponding patches of the example true image and the example adversarial image were calculated. The example shown in FIG. 15(*a*) shows the adversarially perturbed image of a woman where a pair of added glasses fool the Alex Net model to misclassify the image as that of an altogether different man.

The distribution of example Hamming distance patches between patches at the same locations, in FIG. 15(b), illustrates that most patches are well matched with Hamming distances below a threshold value. The threshold value is shown with a red dashed vertical line at 4850 bits. Thus, Hamming distances beyond 4850 bits results in mismatches.

FIG. 15(c) illustrates the maximally mismatched image patches (>4850 bits). These patches correspond well with the pixels that are mismatched between the adversarial image and the true image. However, by bundling the patches together to represent the whole image, the overall normalized Hamming distance between the two images is 0.0372 which is implies very good match between the true and adversarial images.

Figure 16:
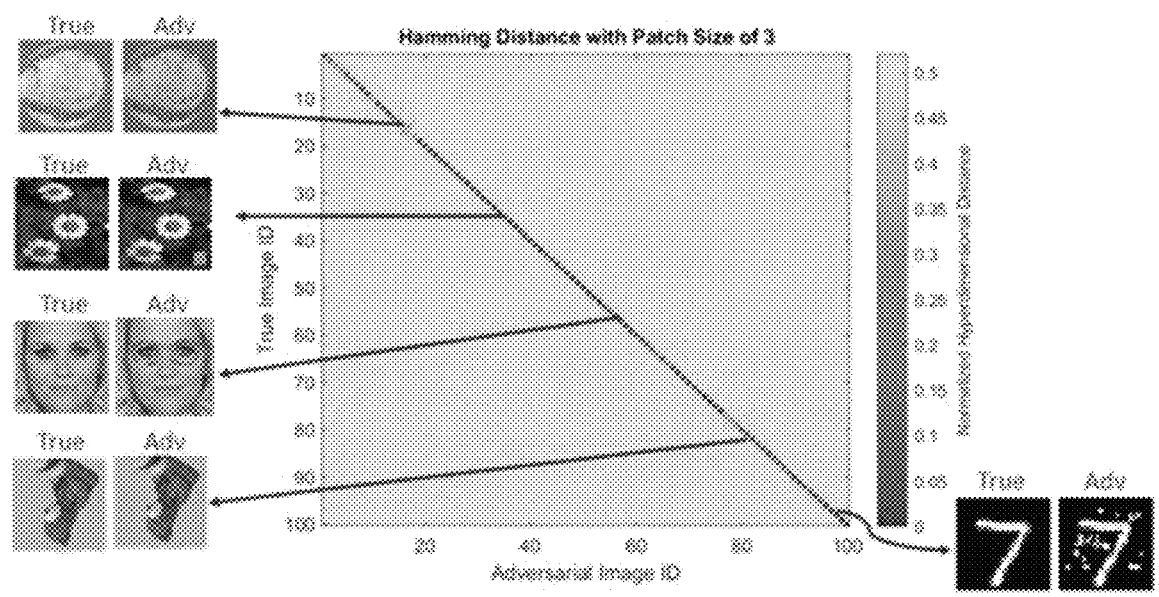
FIG. 16 illustrates results of HDVs encoded from the example apparatus of FIG. 1 produced robust matches between true and adversarial versions of the same image while strongly mismatching with other images (true and adversarial).

Throughout the experiments, this behavior was consistent across all the other images in the adversarial data set. A confusion matrix was generated to verify the behavior for the Hamming distance between each true and adversarial image in the data set. FIG. 16 illustrates results of HDVs encoded from the example apparatus of FIG. 1 produced robust matches between true and adversarial versions of the same image while strongly mismatching with other images (true and adversarial). The robust matches between true and adversarial images and strong mismatches with other images can be seen by the strong diagonal pattern in the confusion matrix. The confusion matrix has a lowest normalized Hamming distance occurring between true and adversarial versions of the same image. The results illustrated by the confusion matrix in FIG. 16 highlights the robustness property of the HDV representation to several the types of adversarial perturbations found in literature (e.g., in the 100 image data set).

Figure 17:
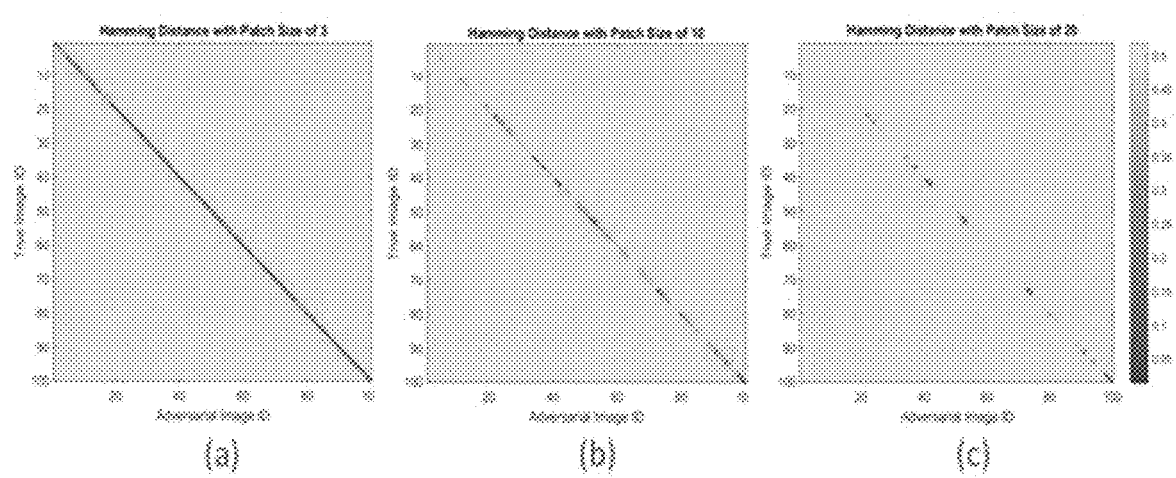
FIG. 17 illustrates results from a second experiment showing the HDVs encoded from the example apparatus of FIG. 1 produced different results based on the size of patches used.

FIG. 17 illustrates results from a second experiment showing the HDVs encoded from the example apparatus of FIG. 1 produced different results based on the size of patches used. The patch size used for HDV generation and bundling of each image factors into the robustness of the ability to classify adversarial perturbations. In some examples, smaller patches result in more robust performance, as seen with the strong true vs. adversarial image matching in the confusion matrix for 3×3 patches (FIG. 17(a)), less strong true vs. adversarial image matching in the confusion matrix for 10×10 patches (FIG. 17(b)), and even less strong true vs. adversarial image matching in the confusion matrix for 20×20 patches (FIG. 17(c)).

Figure 18:
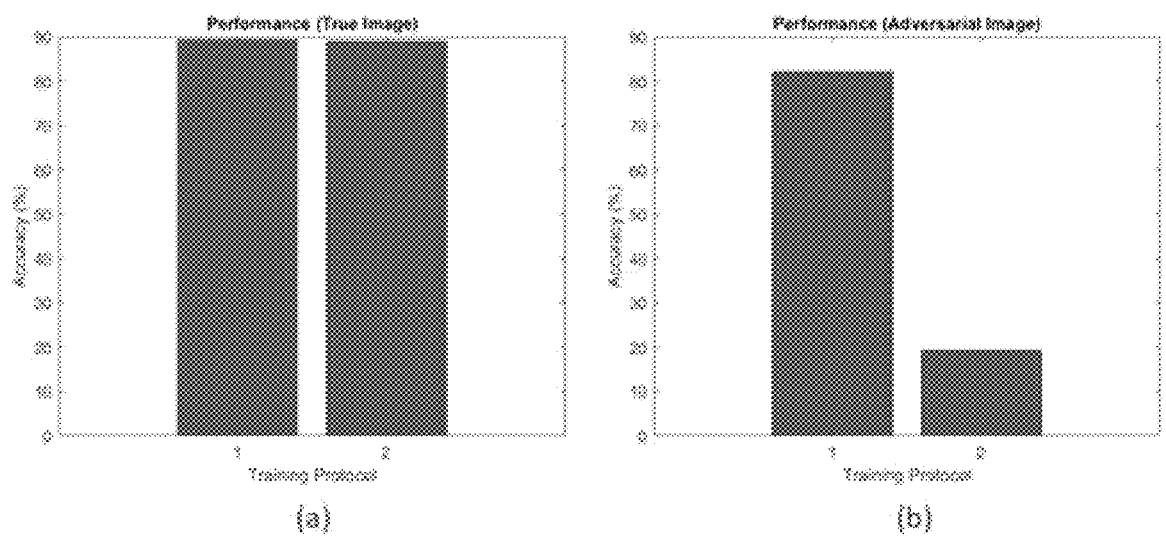
FIG. 18 illustrates results from a third experiment that compared results from images processed by the example apparatus of FIG. 1 to results processed by standard image processing machine learning models.

FIG. 18 illustrates results from a third experiment that compared results from images processed by the example apparatus of FIG. 1 to results processed by standard image processing machine learning models.

In the experiment, example HDVs were generated from true images and then fed as input to a deep model (Alex Net) to train the model. In the inference phase, the input images were purposefully corrupted with perturbations based on various known adversarial perturbation attacks to determine if the model was robust to them.

For comparison, raw perturbed images were fed to the standard Alex Net model during inference as well (i.e., trained on true raw images from the CIFAR 10 dataset). FIG. 18 illustrates the accuracy of the Alex Net to the CIFAR 10 dataset using the example HDVs as inputs. FIG. 18(a) illustrates an inference performance comparison of Alex Net when trained without adversarial perturbations. First using HDVs (FIG. 18(a) left bar (1)), and, second, when using raw images (FIG. 18(a) right bar (2)). FIG. 18(b) illustrates an inference performance comparison of Alex Net when trained with adversarial perturbations. First using HDVs (FIG. 18(b) left bar (1)) and, second, when using raw images (FIG. 18(b) right bar (2)).

The illustrated results of FIG. 18 indicate the accuracy of the Alex Net model using the HD vector-based encoding of true images is similar compared to the model trained on true raw images. Furthermore, HD representation for true images does not significantly affect machine learning model performance. Finally, the accuracy of the Alex Net model is similar to the model trained on true images when HD encoded vectors are used, even when corrupted by adversarial perturbations during inference. But, the Alex Net model performance decreases significantly when trained on raw images without the HD encoding if corrupted by adversarial perturbations during inference.

Although certain example apparatus methods, and articles of manufacture have been disclosed herein, the scope of coverage of this patent is not limited thereto. On the contrary, this patent covers all systems, methods, apparatus, and articles of manufacture fairly falling within the scope of the claims of this patent. Further examples and combinations thereof include the following:

Example 1 includes an apparatus, comprising processor circuitry including one or more of at least one of a central processing unit, a graphic processing unit or a digital signal processor, the at least one of the central processing unit, the graphic processing unit or the digital signal processor having control circuitry to control data movement within the processor circuitry, arithmetic and logic circuitry to perform one or more first operations corresponding to instructions, and one or more registers to store a result of the one or more first operations, the instructions in the apparatus, a Field Programmable Gate Array (FPGA), the FPGA including logic gate circuitry, a plurality of configurable interconnections, and storage circuitry, the logic gate circuitry and interconnections to perform one or more second operations, the storage circuitry to store a result of the one or more second operations, or an Application Specific Integrate Circuitry (ASIC) including logic gate circuitry to perform one or more third operations, the processor circuitry to perform at least one of the first operations, the second operations or the third operations to instantiate seeder circuitry to assign a location value hyperdimensional vector (HDV) to a location in an image of a first patch of one or more pixels, the seeder circuitry to assign at least a first channel HDV to the first patch, the seeder circuitry to determine at least one pixel intensity value HDV for each of the one or more pixels in the first patch, permutater circuitry to permutate the at least one pixel intensity value HDV with a pixel location value for each of the one or more pixels in the first patch, binder circuitry to bind together each of the pixel intensity value HDVs into at least one patch intensity value HDV, the binder circuitry to bind together the at least first channel HDV and the at least one patch intensity value HDV to produce a patch consensus intensity HDV, and the binder circuitry to generate a first hyperdimensional representation patch value HDV of the first patch by binding together at least a combination of the patch consensus intensity HDV and the location value HDV.

Example 2 includes the apparatus of example 1, wherein the processor circuitry is to further perform at least one of the one or more first operations, the one or more second operations or the one or more third operations to instantiate assign a second channel HDV to the first patch, assign a third channel HDV to the first patch, and the first channel HDV representing a red color channel, the second channel HDV representing a green color channel, and the third channel HDV representing a blue color channel.

Example 3 includes the apparatus of example 1, wherein the first channel HDV corresponds to a grayscale channel.

Example 4 includes the apparatus of example 2, wherein the processor circuitry is to further perform at least one of the one or more first operations, the one or more second operations or the one or more third operations to instantiate the seeder circuitry to determine, for each of the one or more pixels in the first patch, a red pixel intensity value HDV to correspond to a red color pixel intensity of each of the one or more pixels in the first patch, the seeder circuitry to determine, for each of the one or more pixels in the first patch, a green pixel intensity value HDV to correspond to a green color pixel intensity of each of the one or more pixels in the first patch, and the seeder circuitry to determine, for each of the one or more pixels in the first patch, a blue pixel intensity value HDV to correspond to a blue color pixel intensity of each of the one or more pixels in the first patch.

Example 5 includes the apparatus of example 4, wherein the processor circuitry is to further perform at least one of the one or more first operations, the one or more second operations or the one or more third operations to instantiate the binder circuitry to bind together at least one of the one or more red pixel intensity value HDVs to produce a red patch intensity value HDV, the binder circuitry to bind together at least one of the one or more green pixel intensity value HDVs to produce a green patch intensity value HDV, and the binder circuitry to bind together at least one of the one or more blue pixel intensity value HDVs to produce a blue patch intensity value HDV.

Example 6 includes the apparatus of example 5, wherein the processor circuitry is to further perform at least one of the one or more first operations, the one or more second operations or the one or more third operations to instantiate the binder circuitry to bind the first channel HDV with the red patch intensity value HDV to produce a red color channel image patch HDV, the binder circuitry to bind the second channel HDV with the green patch intensity value HDV to produce a green color channel image patch HDV, the binder circuitry to bind the third channel HDV with the blue patch intensity value HDV to produce a blue color channel image patch HDV, and consensus sum adder circuitry to calculate a consensus sum of a combination of the red color channel image patch HDV, the green color channel image patch HDV, and the blue color channel image patch HDV to produce the patch consensus HDV.

Example 7 includes the apparatus of example 6, wherein the processor circuitry is to further perform at least one of the one or more first operations, the one or more second operations or the one or more third operations to instantiate segment the image into a plurality of patches, each of the plurality of patches including one or more pixels from the image, the plurality of patches including the first patch, and generate one or more additional hyperdimensional representation patch value HDVs for each of the plurality of patches in addition to the first patch.

Example 8 includes the apparatus of example 7, wherein the processor circuitry is to further perform at least one of the one or more first operations, the one or more second operations or the one or more third operations to instantiate calculate a consensus sum of a combination of all of the generated hyperdimensional representation patch value HDVs to produce a first hyperdimensional representation whole image value HDV.

Example 9 includes the apparatus of example 8, wherein the processor circuitry is to further perform at least one of the one or more first operations, the one or more second operations or the one or more third operations to instantiate provide the first hyperdimensional representation whole image value HDV to a neural network, produce a second hyperdimensional representation whole image value HDV for a second image, provide the second hyperdimensional representation whole image value HDV to the neural network, and the neural network to classify the second image at least in part by comparing the first hyperdimensional representation whole image value HDV to the second hyperdimensional representation whole image value HDV.

Example 10 includes the apparatus of example 8, wherein the processor circuitry is to further perform at least one of the one or more first operations, the one or more second operations or the one or more third operations to instantiate produce a second hyperdimensional representation whole image value HDV for a second image, and generate a Hamming distance between the first and second hyperdimensional representation whole image value HDVs to compare the first image to the second image.

Example 11 includes a non-transitory computer-readable storage medium comprising instructions that, when executed, cause one or more processors of a machine to at least assign a location value hyperdimensional vector (HDV) to a location in an image of a first patch of one or more pixels, assign at least a first channel HDV to the first patch, determine at least one pixel intensity value HDV for each of the one or more pixels in the first patch, permutate the at least one pixel intensity value HDV with a pixel location value for each of the one or more pixels in the first patch, bind together each of the pixel intensity value HDVs into at least one patch intensity value HDV, bind together the at least first channel HDV and the at least one patch intensity value HDV to produce a patch consensus HDV, and generate a first hyperdimensional representation patch value HDV of the first patch by binding together at least a combination of the patch consensus HDV and the location value HDV.

Example 12 includes the non-transitory computer-readable storage medium of example 11, wherein the instructions, when executed, cause the one or more processors of the machine to at least assign a second channel HDV to the first patch, assign a third channel HDV to the first patch, and the first channel HDV corresponding to a red color channel, the second channel HDV representing a green color channel, and the third channel HDV representing a blue color channel.

Example 13 includes the non-transitory computer-readable storage medium of example of example 11, wherein the first channel HDV corresponds to a grayscale channel.

Example 14 includes the non-transitory computer-readable storage medium of example 12, wherein the instructions, when executed, cause the one or more processors of the machine to determine, for each of the one or more pixels in the first patch, a red pixel intensity value HDV to correspond to a red color pixel intensity of each of the one or more pixels in the first patch, determine, for each of the one or more pixels in the first patch, a green pixel intensity value HDV to correspond to a green color pixel intensity of each of the one or more pixels in the first patch, and determine, for each of the one or more pixels in the first patch, a blue pixel intensity value HDV to correspond to a blue color pixel intensity of each of the one or more pixels in the first patch.

Example 15 includes the non-transitory computer-readable storage medium of example 14, wherein the instructions, when executed, cause the one or more processors of the machine to bind together all of the one or more red pixel intensity value HDVs to produce a red patch intensity value HDV, bind together all of the one or more green pixel intensity value HDVs to produce a green patch intensity value HDV, and bind together all of the one or more blue pixel intensity value HDVs to produce a blue patch intensity value HDV.

Example 16 includes the non-transitory computer-readable storage medium of example 15, wherein the instructions, when executed, cause the one or more processors of the machine to bind the first channel HDV with the red patch intensity value HDV to produce a red color channel image patch HDV, bind the second channel HDV with the green patch intensity value HDV to produce a green color channel image patch HDV, bind the third channel HDV with the blue patch intensity value HDV to produce a blue color channel image patch HDV, and calculate a consensus sum of a combination of the red color channel image patch HDV, the green color channel image patch HDV, and the blue color channel image patch HDV to produce the patch consensus HDV.

Example 17 includes the non-transitory computer-readable storage medium of example 16, wherein the instructions, when executed, cause the one or more processors of the machine to segment the image into a plurality of patches, each of the plurality of patches including one or more pixels from the image, the plurality of patches including the first patch, and generate one or more additional hyperdimensional representation patch value HDVs for each of the plurality of patches in addition to the first patch.

Example 18 includes the non-transitory computer-readable storage medium of example 17, wherein the instructions, when executed, cause the one or more processors of the machine to calculate a consensus sum of a combination of all of the generated hyperdimensional representation patch value HDVs to produce a first hyperdimensional representation whole image value HDV.

Example 19 includes the non-transitory computer-readable storage medium of example 18, wherein the instructions, when executed, cause the one or more processors of the machine to provide a neural network the first hyperdimensional representation whole image value HDV, produce a second hyperdimensional representation whole image value HDV for a second image, provide the neural network a second hyperdimensional representation whole image value HDV, and the neural network to classify the second image at least in part by comparing the first hyperdimensional representation whole image value HDV to the second hyperdimensional representation whole image value HDV.

Example 20 includes the non-transitory computer-readable storage medium of example 18, wherein the instructions, when executed, cause the one or more processors of the machine to produce a second hyperdimensional representation whole image value HDV for a second image, and generate a Hamming distance between the first and second hyperdimensional representation whole image value HDVs to compare the first image to the second image.

Example 21 includes an apparatus, comprising processor circuitry including one or more of at least one of a central processing unit, a graphic processing unit or a digital signal processor, the at least one of the central processing unit, the graphic processing unit or the digital signal processor having control circuitry to control data movement within the processor circuitry, arithmetic and logic circuitry to perform one or more first operations corresponding to instructions, and one or more registers to store a result of the one or more first operations, the instructions in the apparatus, a Field Programmable Gate Array (FPGA), the FPGA including logic gate circuitry, a plurality of configurable interconnections, and storage circuitry, the logic gate circuitry and interconnections to perform one or more second operations, the storage circuitry to store a result of the one or more second operations, or an Application Specific Integrate Circuitry (ASIC) including logic gate circuitry to perform one or more third operations, the processor circuitry to perform at least one of the one or more first operations, the one or more second operations or the one or more third operations to instantiate neural network circuitry, including neural network filter circuitry to receive a true image, the neural network filter circuitry to encode the true image into a hyperdimensional representation whole image value hyperdimensional vector (HDV), the neural network filter circuitry to provide the hyperdimensional representation whole image value HDV to a neural network classifier, and neural network trainer circuitry to train the neural network circuitry with the neural network classifier.

Example 22 includes the apparatus of example 21, wherein the processor circuitry is to further perform at least one of the one or more first operations, the one or more second operations or the one or more third operations to instantiate the neural network filter circuitry to receive an adversarial image with at least one adversarial perturbation, and neural network classifier circuitry to classify the adversarial image as having an adversarial perturbation.

Example 23 includes the apparatus of example 22, wherein the processor circuitry is to further perform at least one of the one or more first operations, the one or more second operations or the one or more third operations to instantiate the neural network filter circuitry to segment the adversarial image into a plurality of patches, and the neural network filter circuitry to encode each patch in the plurality of patches into a plurality of hyperdimensional representation patch value HDVs.

Example 24 includes the apparatus of example 23, wherein the processor circuitry is to further perform at least one of the one or more first operations, the one or more second operations or the one or more third operations to instantiate the neural network filter circuitry to calculate a consensus sum of the plurality of hyperdimensional representation patch value HDVs into the hyperdimensional representation whole image value HDV.

Example 25 includes a method, comprising assigning a location value hyperdimensional vector (HDV) to a location in an image of a first patch of one or more pixels, assigning at least a first channel HDV to the first patch, determining at least one pixel intensity value HDV for each of the one or more pixels in the first patch, permutating the at least one pixel intensity value HDV with a pixel location value for each of the one or more pixels in the first patch, binding together each of the pixel intensity value HDVs into at least one patch intensity value HDV, binding together the at least first channel HDV and the at least one patch intensity value HDV to produce a patch consensus HDV, and generating a first hyperdimensional representation patch value HDV of the first patch by binding together at least a combination of the patch consensus intensity HDV and the location value HDV.

Example 26 includes the method of example 25, further including assigning a second channel intensity HDV to the first patch, assigning a third channel intensity HDV to the first patch, and the first channel HDV representing a red color channel, the second channel HDV representing a green color channel, and the third channel HDV representing a blue color channel.

Example 27 includes the method of example 25, wherein the first intensity channel HDV corresponds to a grayscale channel.

Example 28 includes the method of example 26, wherein determining at least one pixel intensity value HDV for each of the one or more pixels in the first patch further includes determining a red pixel intensity value HDV for each of the one or more pixels in the first patch to correspond to a red color pixel intensity of each of the one or more pixels in the first patch, determining a green pixel intensity value HDV for each of the one or more pixels in the first patch to correspond to a green color pixel intensity of each of the one or more pixels in the first patch, and determining a blue pixel intensity value HDV for each of the one or more pixels in the first patch to correspond to a blue color pixel intensity of each of the one or more pixels in the first patch.

Example 29 includes the method of example 28, wherein binding together each of the pixel intensity value HDVs into at least one patch intensity value HDV further includes binding together all of the one or more red pixel intensity value HDVs to produce a red patch intensity value HDV, binding together all of the one or more green pixel intensity value HDVs to produce a green patch intensity value HDV, and binding together all of the one or more blue pixel intensity value HDVs to produce a blue patch intensity value HDV.

Example 306 includes the method of example 29, wherein binding together the at least first channel HDV and the at least one patch intensity value HDV to produce a patch consensus intensity HDV further includes binding the first channel HDV with the red patch intensity value HDV to produce a red color channel image patch HDV, binding the second channel HDV with the green patch intensity value HDV to produce a green color channel image patch HDV, binding the third channel HDV with the blue patch intensity value HDV to produce a blue color channel image patch HDV, and calculating a consensus sum of a combination of the red color channel image patch HDV, the green color channel image patch HDV, and the blue color channel image patch HDV to produce the patch consensus HDV.

Example 31 includes the method of example 30, further including segmenting the image into a plurality of patches, each of the plurality of patches including one or more pixels from the image, the plurality of patches including the first patch, and generating one or more additional hyperdimensional representation patch value HDVs for each of the plurality of patches in addition to the first patch.

Example 32 includes the method of example 31, further including calculating a consensus sum of a combination of all of the generated hyperdimensional representation patch value HDVs to produce a first hyperdimensional representation whole image value HDV.

Example 33 includes the method of example 32, further including producing a second hyperdimensional representation whole image value HDV for a second image, and generating a Hamming distance between the first and second hyperdimensional representation whole image value HDVs to compare the first image to the second image.

The following claims are hereby incorporated into this Detailed Description by this reference, with each claim standing on its own.

What is claimed is:

1. An apparatus, comprising:
   interface circuitry;
   computer readable instructions; and
   processor circuitry to:
   assign a location value hyperdimensional vector (HDV) to a location in an image of a patch of one or more pixels;
   assign a channel HDV to the patch;
   determine at least one pixel intensity value HDV for respective ones of the one or more pixels in the patch;
   permutate respective ones of the pixel intensity value HDVs with corresponding pixel location values for respective ones of the one or more pixels in the patch;
   combine the pixel intensity value HDVs into at least one patch intensity value HDV;
   combine the channel HDV and the at least one patch intensity value HDV to produce a patch consensus intensity HDV; and
   generate a first hyperdimensional representation patch value HDV of the patch by binding together at least the patch consensus intensity HDV and the location value HDV.

2. The apparatus of claim 1, wherein the channel HDV is a first channel HDV, and the processor circuitry is to:
   assign a second channel HDV to the patch;
   assign a third channel HDV to the patch; and
   the first channel HDV represents a red color channel, the second channel HDV represents a green color channel, and the third channel HDV represents a blue color channel.

3. The apparatus of claim 2, wherein the processor circuitry is to:
   determine, for respective ones of the one or more pixels in the patch, a red pixel intensity value HDV;
   determine, for respective ones of the one or more pixels in the patch, a green pixel intensity value HDV; and
   determine, for respective ones of the one or more pixels in the patch, a blue pixel intensity value HDV.

4. The apparatus of claim 3, wherein the processor circuitry is to:
   combine at least one of the one or more red pixel intensity value HDVs to produce a red patch intensity value HDV;
   combine at least one of the one or more green pixel intensity value HDVs to produce a green patch intensity value HDV; and
   combine at least one of the one or more blue pixel intensity value HDVs to produce a blue patch intensity value HDV.

5. The apparatus of claim 4, wherein the processor circuitry is to:
   combine the first channel HDV with the red patch intensity value HDV to produce a red color channel image patch HDV;
   combine the second channel HDV with the green patch intensity value HDV to produce a green color channel image patch HDV;
   combine the third channel HDV with the blue patch intensity value HDV to produce a blue color channel image patch HDV; and
   calculate a consensus sum of a combination of the red color channel image patch HDV, the green color channel image patch HDV, and the blue color channel image patch HDV to produce the patch consensus HDV.

6. The apparatus of claim 5, wherein the processor circuitry is to:

segment the image into a plurality of patches, respective ones of the patches including one or more pixels from the image, the plurality of patches including the patch; and generate one or more additional hyperdimensional representation patch value HDVs for respective ones of the patches.

7. The apparatus of claim 6, wherein the processor circuitry is to:

calculate a consensus sum of a combination of the generated hyperdimensional representation patch value HDVs to produce a first hyperdimensional representation whole image value HDV.

8. The apparatus of claim 7, wherein the image is a first image, and the processor circuitry is to:

provide the first hyperdimensional representation whole image value HDV to a neural network;

produce a second hyperdimensional representation whole image value HDV for a second image; and provide the second hyperdimensional representation whole image value HDV to the neural network;

wherein the neural network is to classify the second image at least in part by comparing the first hyperdimensional representation whole image value HDV to the second hyperdimensional representation whole image value HDV.

9. The apparatus of claim 7, wherein the image is a first image, and the processor circuitry is to:

produce a second hyperdimensional representation whole image value HDV for a second image; and generate a Hamming distance between the first and second hyperdimensional representation whole image value HDVs to compare the first image to the second image.

10. The apparatus of claim 8, wherein:

the processor circuitry is to:

encode the first image into the first hyperdimensional representation whole image value HDV; and train the neural network.

11. The apparatus of claim 10, wherein the processor circuitry is to:

access an adversarial image with at least one adversarial perturbation; and classify the adversarial image as having an adversarial perturbation.

12. The apparatus of claim 11, wherein the processor circuitry is to:

segment the adversarial image into a plurality of patches; and encode respective ones of the patches into a plurality of hyperdimensional representation patch value HDVs.

13. The apparatus of claim 12, wherein the processor circuitry is to:

calculate a consensus sum of the plurality of hyperdimensional representation patch value HDVs into the hyperdimensional representation whole image value HDV.

14. The apparatus of claim 1, wherein the first channel HDV corresponds to a grayscale channel.

15. The apparatus of claim 1, wherein the processor circuitry includes at least one of a central processing unit, a graphic processing unit, a digital signal processor, a Field Programmable Gate Array (FPGA), or an Application Specific Integrate Circuitry (ASIC).

16. At least one non-transitory computer-readable storage medium comprising instructions that, when executed, cause one or more processors of a machine to at least:

assign a location value hyperdimensional vector (HDV) to a location in an image of a patch of one or more pixels;

assign a channel HDV to the patch;

determine at least one pixel intensity value HDV for respective ones of the one or more pixels in the patch;

permutate respective ones of the at least one pixel intensity value HDVs with corresponding pixel location values for respective ones of the one or more pixels in the patch;

combine the pixel intensity value HDVs into at least one patch intensity value HDV;

combine the channel HDV and the at least one patch intensity value HDV to produce a patch consensus HDV; and generate a first hyperdimensional representation patch value HDV of the patch by binding together at least the patch consensus HDV and the location value HDV.

17. The at least one non-transitory computer-readable storage medium of claim 16, wherein the channel HDV is a first channel HDV, and the instructions, when executed, cause the one or more processors of the machine to at least:

assign a second channel HDV to the patch;

assign a third channel HDV to the patch; and the first channel HDV represents a red color channel, the second channel HDV represents a green color channel, and the third channel HDV represents a blue color channel.

18. The at least one non-transitory computer-readable storage medium of claim 16, wherein the channel HDV corresponds to a grayscale channel.

19. The at least one non-transitory computer-readable storage medium of claim 17, wherein the instructions, when executed, cause the one or more processors of the machine to:

determine, for respective ones of the one or more pixels in the patch, a red pixel intensity value HDV;

determine, for respective ones of the one or more pixels in the patch, a green pixel intensity value HDV; and determine, for respective ones of the one or more pixels in the patch, a blue pixel intensity value HDV.

20. The at least one non-transitory computer-readable storage medium of claim 19, wherein the instructions, when executed, cause the one or more processors of the machine to:

combine the one or more red pixel intensity value HDVs to produce a red patch intensity value HDV;

combine the one or more green pixel intensity value HDVs to produce a green patch intensity value HDV; and combine the one or more blue pixel intensity value HDVs to produce a blue patch intensity value HDV.

21. The at least one non-transitory computer-readable storage medium of claim 20, wherein the instructions, when executed, cause the one or more processors of the machine to:

combine the first channel HDV with the red patch intensity value HDV to produce a red color channel image patch HDV;

combine the second channel HDV with the green patch intensity value HDV to produce a green color channel image patch HDV;

combine the third channel HDV with the blue patch intensity value HDV to produce a blue color channel image patch HDV; and calculate a consensus sum of a combination of the red color channel image patch HDV, the green color channel image patch HDV, and the blue color channel image patch HDV to produce the patch consensus HDV.

22. The at least one non-transitory computer-readable storage medium of claim 21, wherein the instructions, when executed, cause the one or more processors of the machine to:
segment the image into a plurality of patches, respective ones of the patches including one or more pixels from the image, the plurality of patches including the patch; and
generate one or more additional hyperdimensional representation patch value HDVs for respective ones of the patches.

23. The at least one non-transitory computer-readable storage medium of claim 22, wherein the instructions, when executed, cause the one or more processors of the machine to:
calculate a consensus sum of a combination of the generated hyperdimensional representation patch value HDVs to produce a first hyperdimensional representation whole image value HDV.

24. The at least one non-transitory computer-readable storage medium of claim 23, wherein the image is a first image, and the instructions, when executed, cause the one or more processors of the machine to:
provide a neural network the first hyperdimensional representation whole image value HDV;
produce a second hyperdimensional representation whole image value HDV for a second image; and
provide the neural network a second hyperdimensional representation whole image value HDV;
wherein the neural network is to classify the second image at least in part by comparing the first hyperdimensional representation whole image value HDV to the second hyperdimensional representation whole image value HDV.

25. The at least one non-transitory computer-readable storage medium of claim 23, wherein the image is a first image, and the instructions, when executed, cause the one or more processors of the machine to:
produce a second hyperdimensional representation whole image value HDV for a second image; and
generate a Hamming distance between the first and second hyperdimensional representation whole image value HDVs to compare the first image to the second image.

* * * * *